United States Patent
Wang et al.

(10) Patent No.: US 12,432,975 B2
(45) Date of Patent: Sep. 30, 2025

(54) SEMICONDUCTOR DEVICE WITH BACKSIDE POWER RAIL

(71) Applicant: Taiwan Semiconductor Manufacturing Company, Ltd., Hsin-Chu (TW)

(72) Inventors: Pei-Yu Wang, Hsinchu (TW); Yu-Xuan Huang, Hsinchu (TW); Huan-Chieh Su, Changhua County (TW); Chun-Yuan Chen, HsinChu (TW); Li-Zhen Yu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 415 days.

(21) Appl. No.: 18/172,518

(22) Filed: Feb. 22, 2023

(65) Prior Publication Data
US 2024/0014283 A1   Jan. 11, 2024

Related U.S. Application Data

(60) Provisional application No. 63/382,145, filed on Nov. 3, 2022, provisional application No. 63/359,489, filed on Jul. 8, 2022.

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .......... H10D 30/6735; H10D 30/019
See application file for complete search history.

(56) References Cited

U.S. PATENT DOCUMENTS

| 10,923,474 B2 * | 2/2021 | Liaw ................. H10D 62/116 |
| 11,296,082 B2 | 4/2022 | Chuang et al. |

(Continued)

FOREIGN PATENT DOCUMENTS

TW    202209449 A    3/2022

*Primary Examiner* — Nduka E Ojeh
(74) *Attorney, Agent, or Firm* — HAYNES AND BOONE, LLP

(57) ABSTRACT

A method of fabricating a semiconductor device includes providing a dummy structure including channel layers disposed over a frontside of a substrate, inner spacers disposed between adjacent channels of the channel layers and at lateral ends of the channel layers, and a gate structure interposing the plurality of channel layers. The dummy structure is disposed at an active edge adjacent to an active region. Perform an etching process to etch the gate structure and the plurality of channel layers to form a cut region along the active edge. Deposit a conductive material in the cut region to form a conductive feature. The method further includes thinning the substrate from a backside of the substrate to expose the conductive feature and forming a backside metal wiring layer on the backside of the substrate. The backside metal wiring layer is in electrical connection with the conductive feature.

20 Claims, 24 Drawing Sheets

A-A

(51) Int. Cl.
*H10D 30/43* (2025.01)
*H10D 62/10* (2025.01)
*H10D 64/01* (2025.01)
*H10D 84/01* (2025.01)
*H10D 84/03* (2025.01)

(52) U.S. Cl.
CPC ..... *H10D 30/6729* (2025.01); *H10D 30/6757* (2025.01); *H10D 62/121* (2025.01); *H10D 64/021* (2025.01); *H10D 84/0128* (2025.01); *H10D 84/0147* (2025.01); *H10D 84/0149* (2025.01); *H10D 84/0151* (2025.01); *H10D 84/038* (2025.01)

(56) References Cited

U.S. PATENT DOCUMENTS

| | | | |
|---|---|---|---|
| 2020/0105761 A1* | 4/2020 | Liaw | H10D 84/853 |
| 2020/0350433 A1 | 11/2020 | Ko et al. | |
| 2021/0126113 A1* | 4/2021 | Lin | H10D 30/6219 |
| 2021/0183855 A1 | 6/2021 | Ng et al. | |
| 2022/0013522 A1 | 1/2022 | Li et al. | |

* cited by examiner

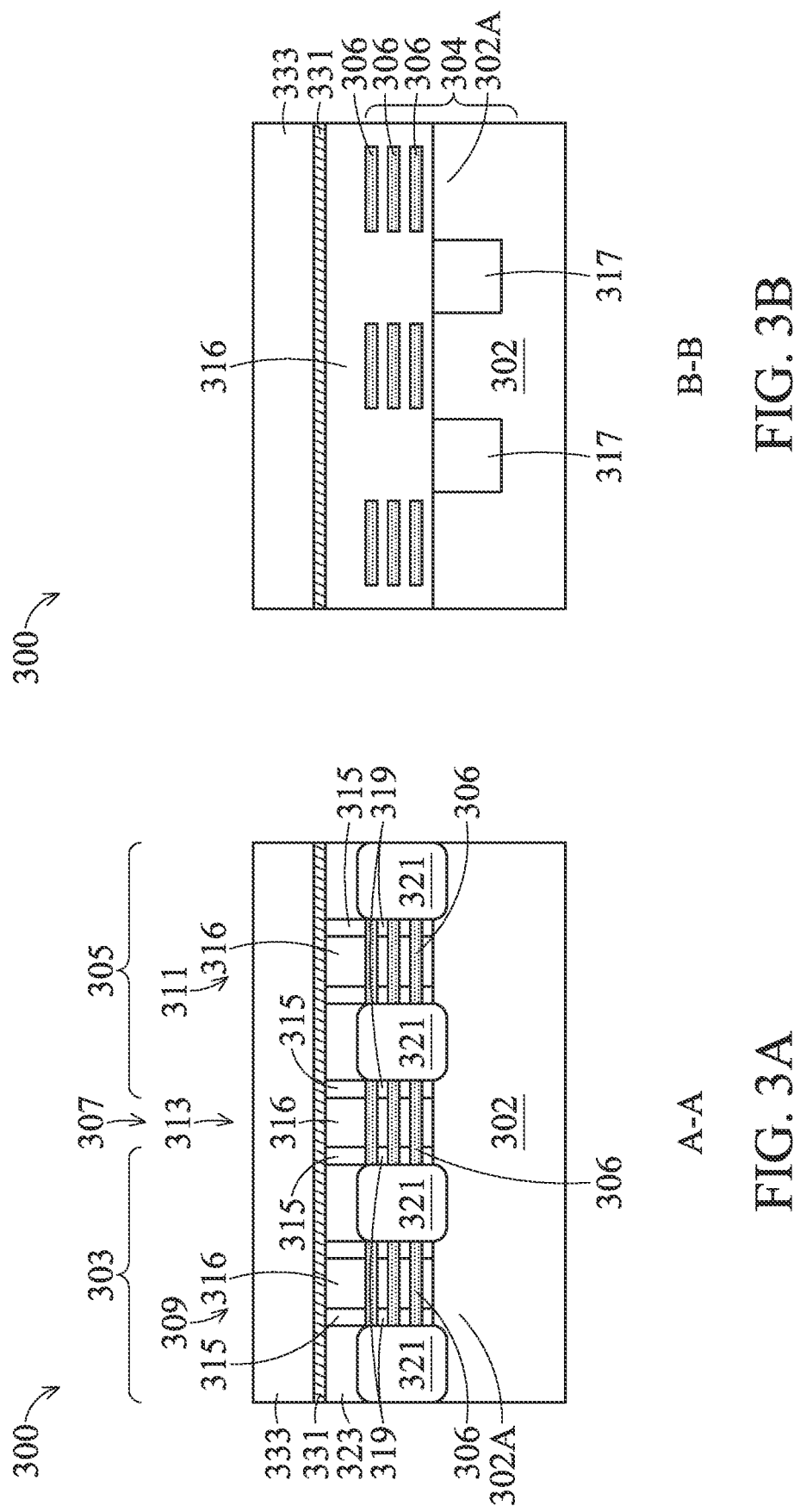

A-A

B-B

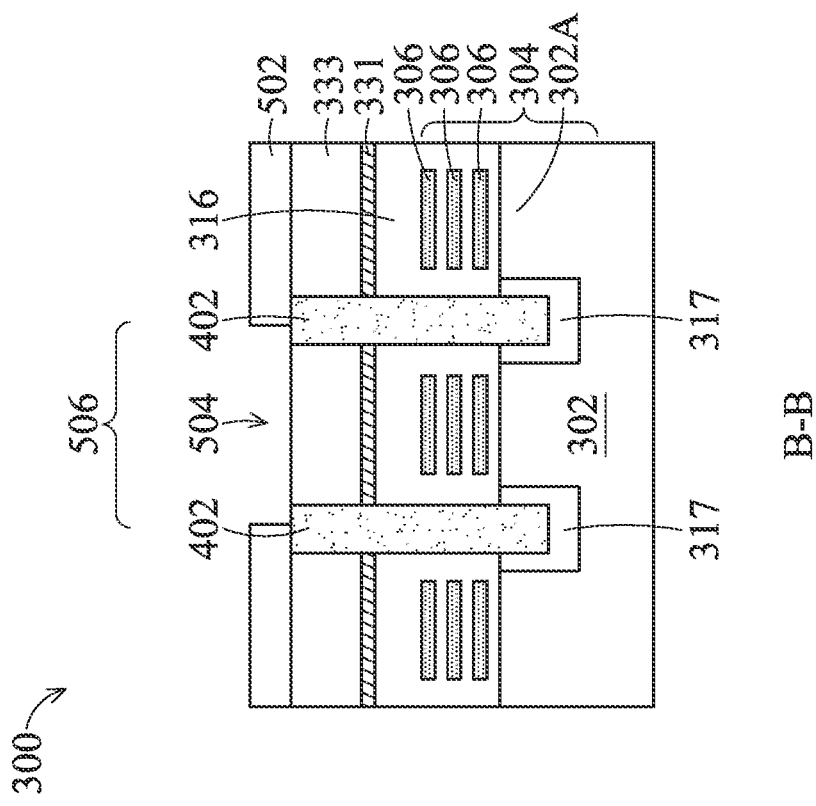
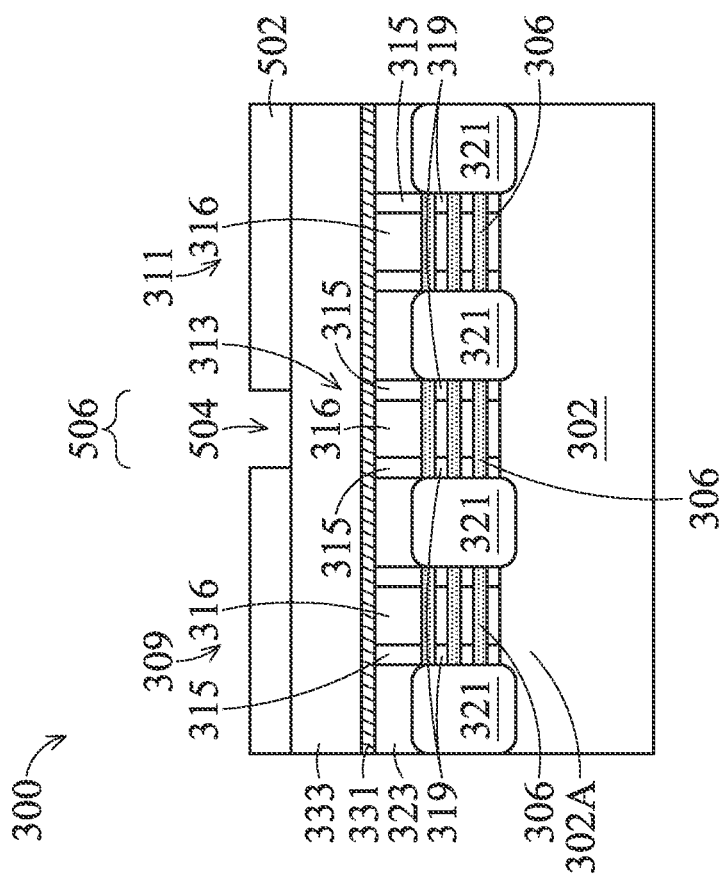
FIG. 7A
FIG. 7B

A-A

B-B

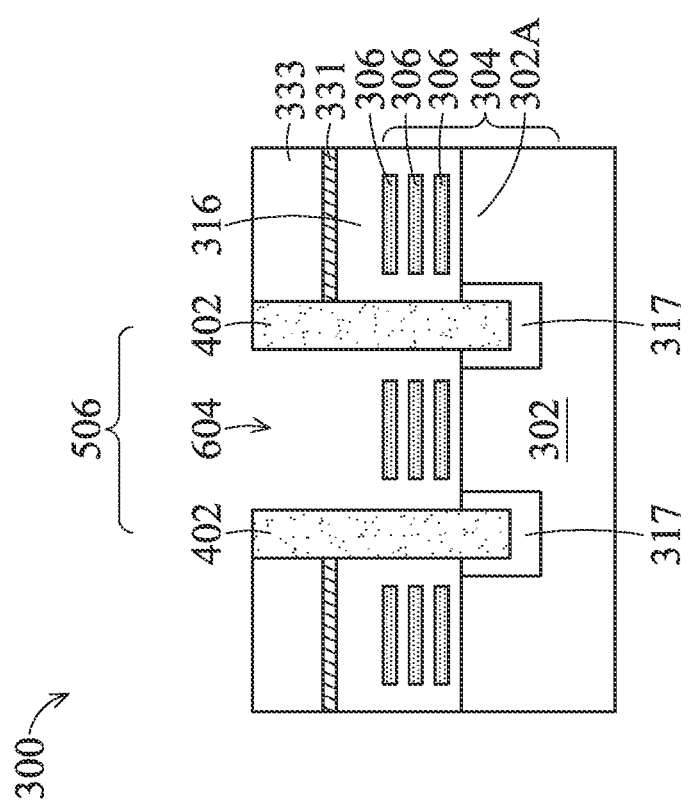
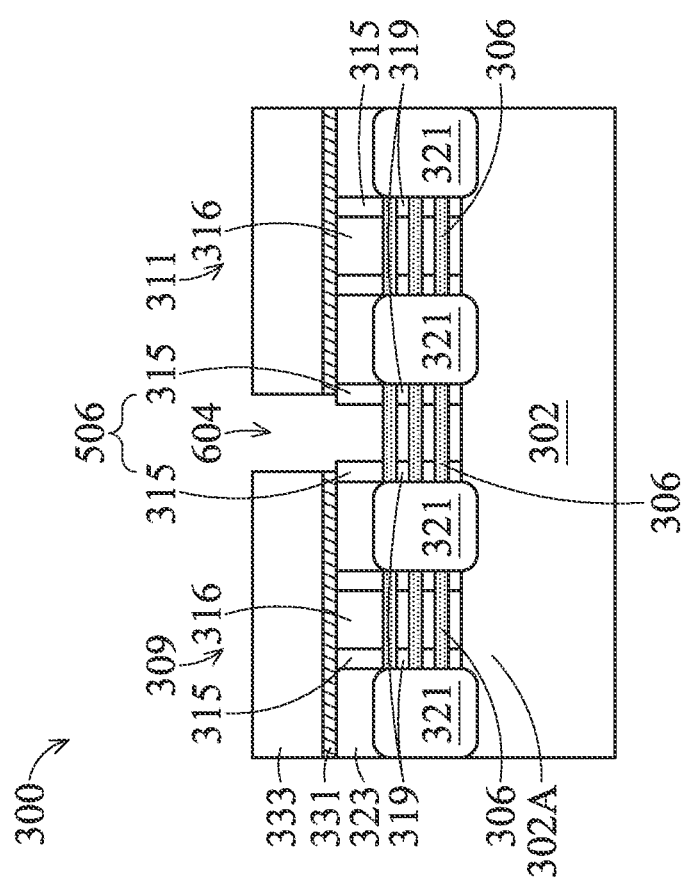
FIG. 9A
FIG. 9B

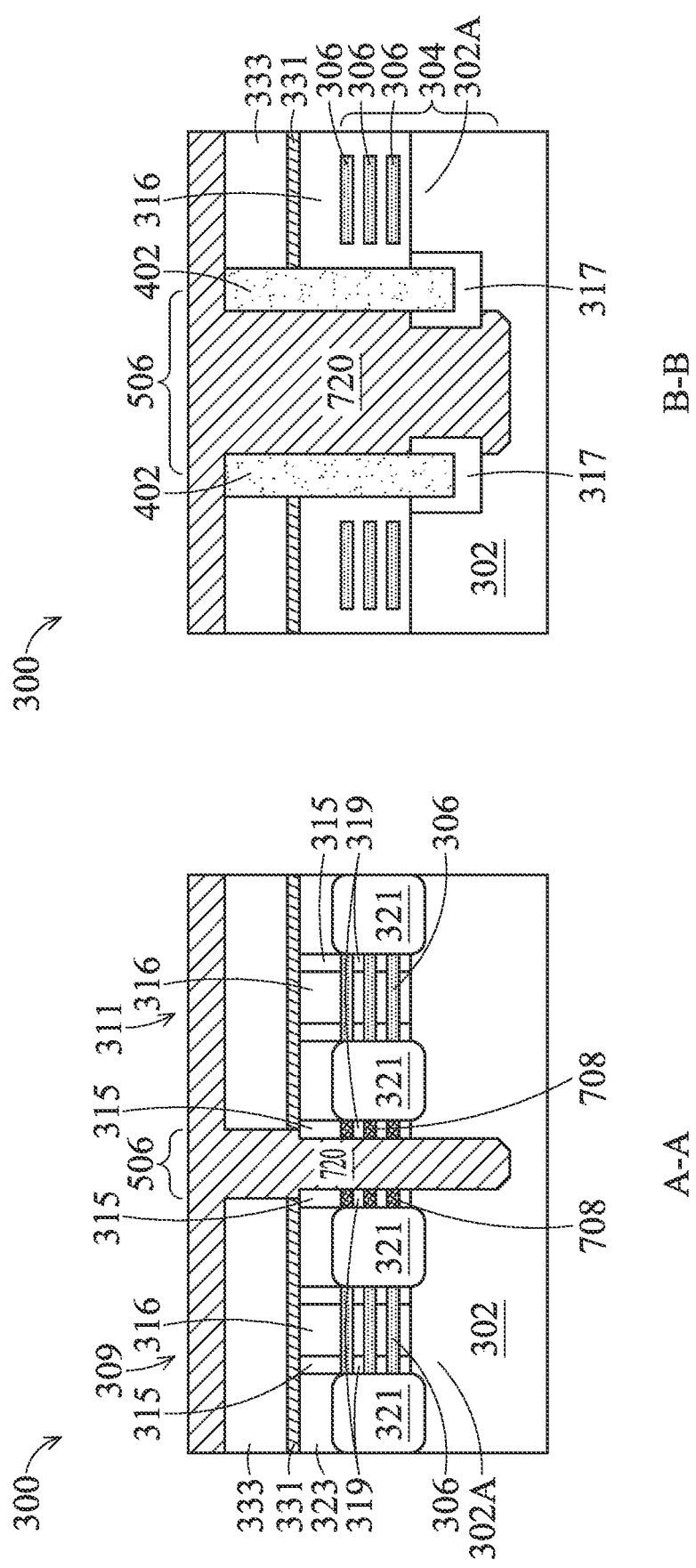

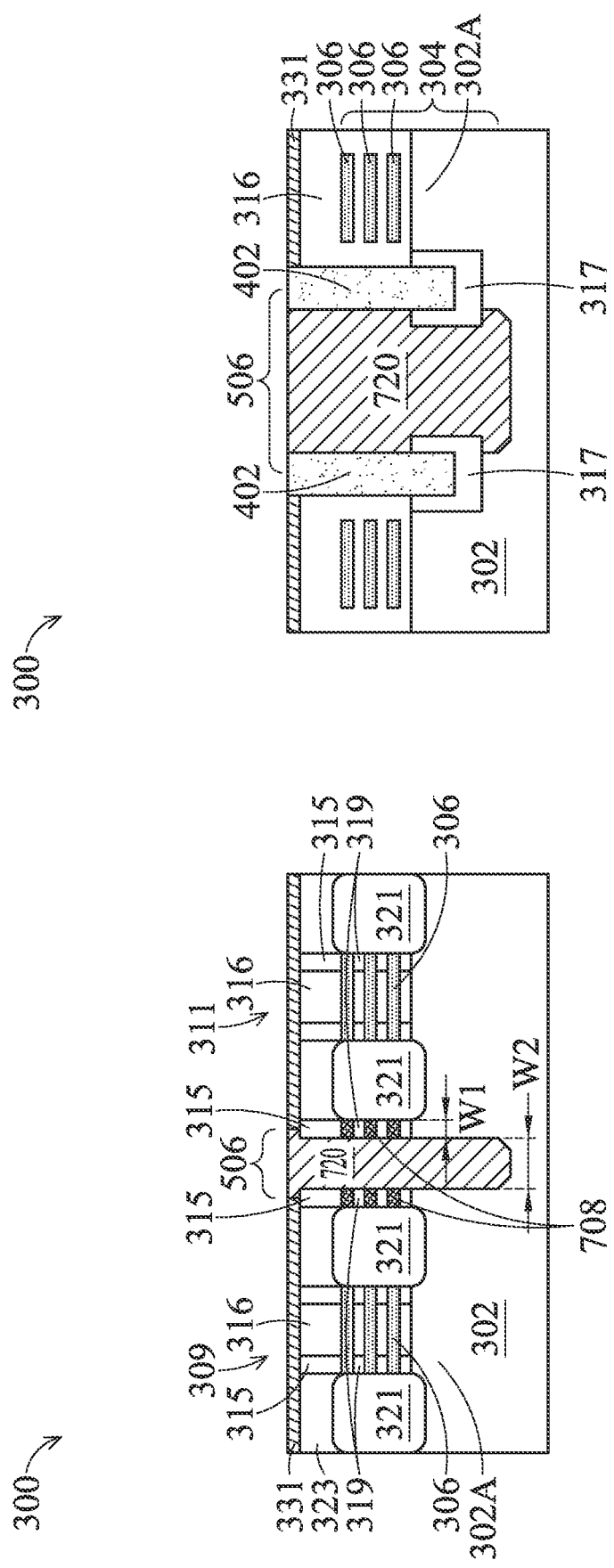
FIG. 14A  A-A
FIG. 14B  B-B

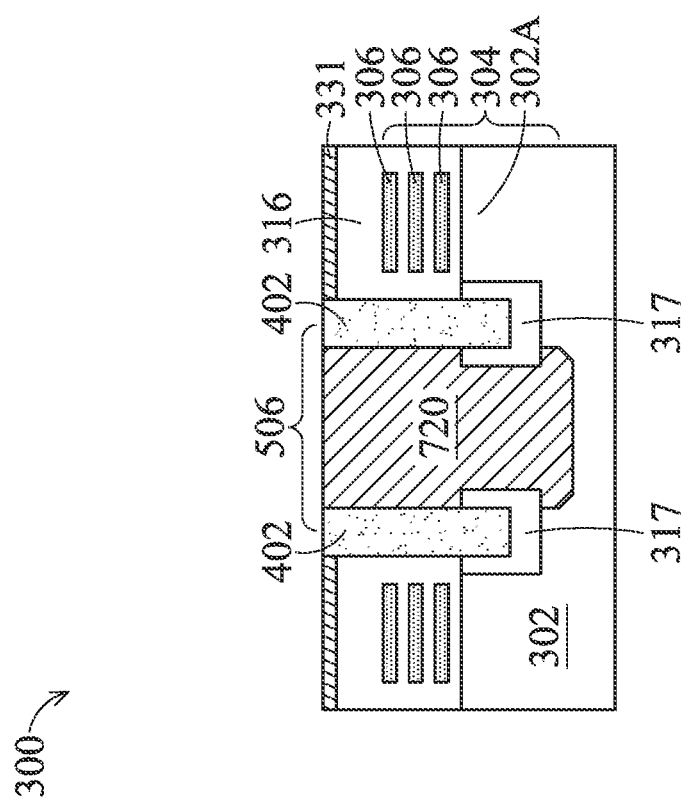
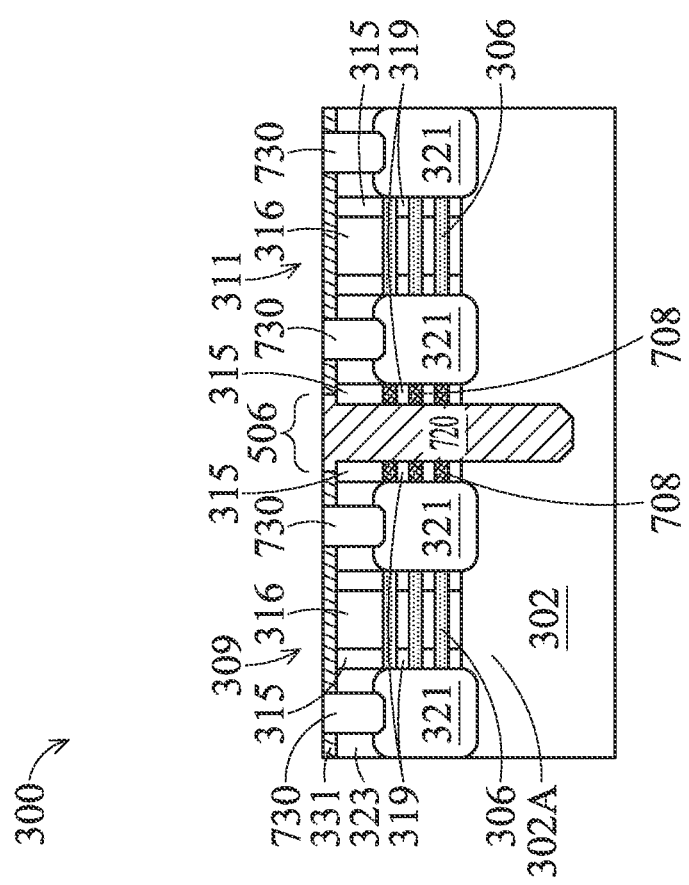
FIG. 15A
FIG. 15B

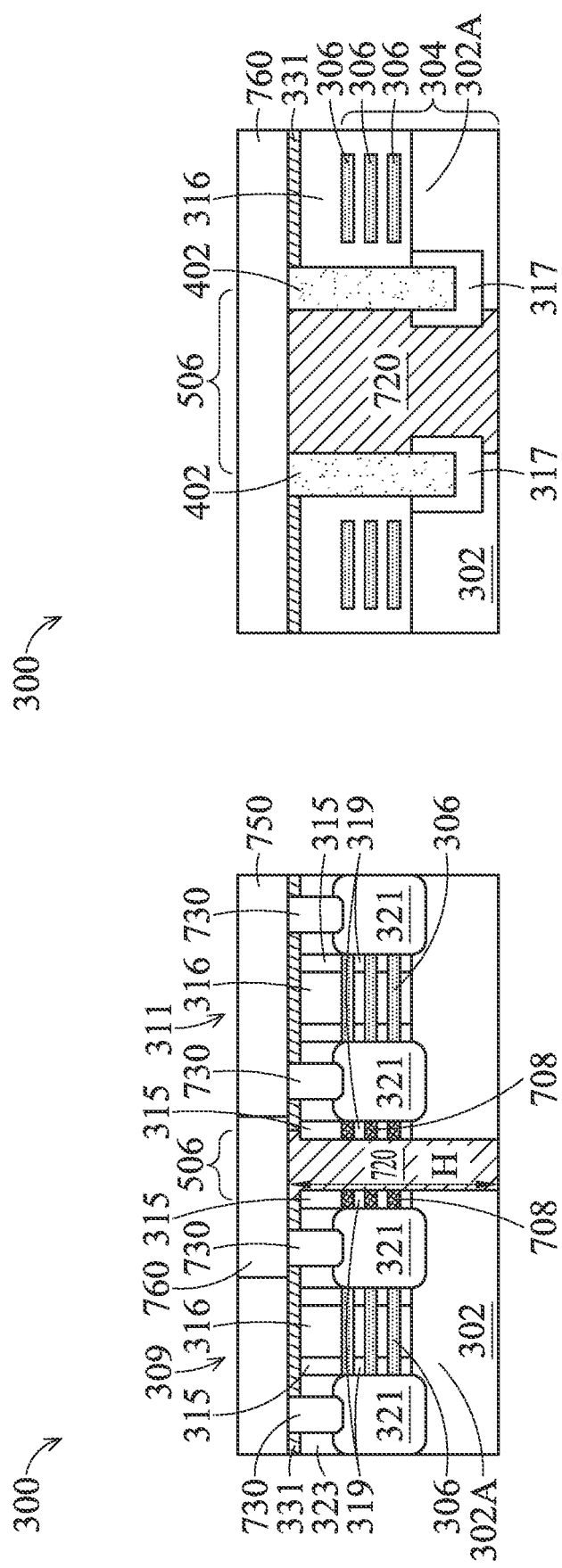
FIG. 17B  B-B
FIG. 17A  A-A

SEMICONDUCTOR DEVICE WITH BACKSIDE POWER RAIL

PRIORITY DATA

This application claims the benefit of U.S. Provisional Application No. 63/359,489, filed Jul. 8, 2022, and U.S. Provisional Application No. 63/382,145, filed Nov. 3, 2022, the disclosures of which are hereby incorporated by reference in entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFETs and GAA devices are compatible with conventional complementary metal-oxide-semiconductor (CMOS) processes and their three-dimensional structure allows them to be aggressively scaled while maintaining gate control and mitigating SCEs.

Multi-gate devices (e.g., FinFETs and GAA devices) are often built in a stacked-up fashion, having transistors at the lowest level and interconnect (vias and wires) on top of the transistors to provide connectivity to the transistors. Power rails (such as metal lines for voltage sources and ground planes) are also above the transistors and may be part of the interconnect. As the integrated circuits continue to scale down, so do the power rails. Limiting power rails only on top of the transistors may lead to increased voltage drop across the power rails, as well as increased power consumption of the integrated circuits. One area of interest is how to form power rails on both the frontside and backside of an integrated circuit. Therefore, although existing approaches in semiconductor fabrication have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A, 17A, 18A, 19A, 20A, 21A, and 22A provide cross-sectional views of an embodiment of a semiconductor device along a plane substantially parallel to a plane defined by a cutline A-A of FIG. 1 at various stages of the method of FIG. 2, according to one or more aspects of the present disclosure.

FIGS. 3B, 4B, 5B, 6B, 7B, 8B, 9B, 10B, 11B, 12B, 13B, 14B, 15B, 16B, 17B, 18B, 19B, 20B, 21B, and 22B provide cross-sectional views of an embodiment of a semiconductor device along a plane substantially parallel to a plane defined by a cutline B-B of FIG. 1 at various stages of the method of FIG. 2, according to one or more aspects of the present disclosure.

DETAILED DESCRIPTION

Figure 1:
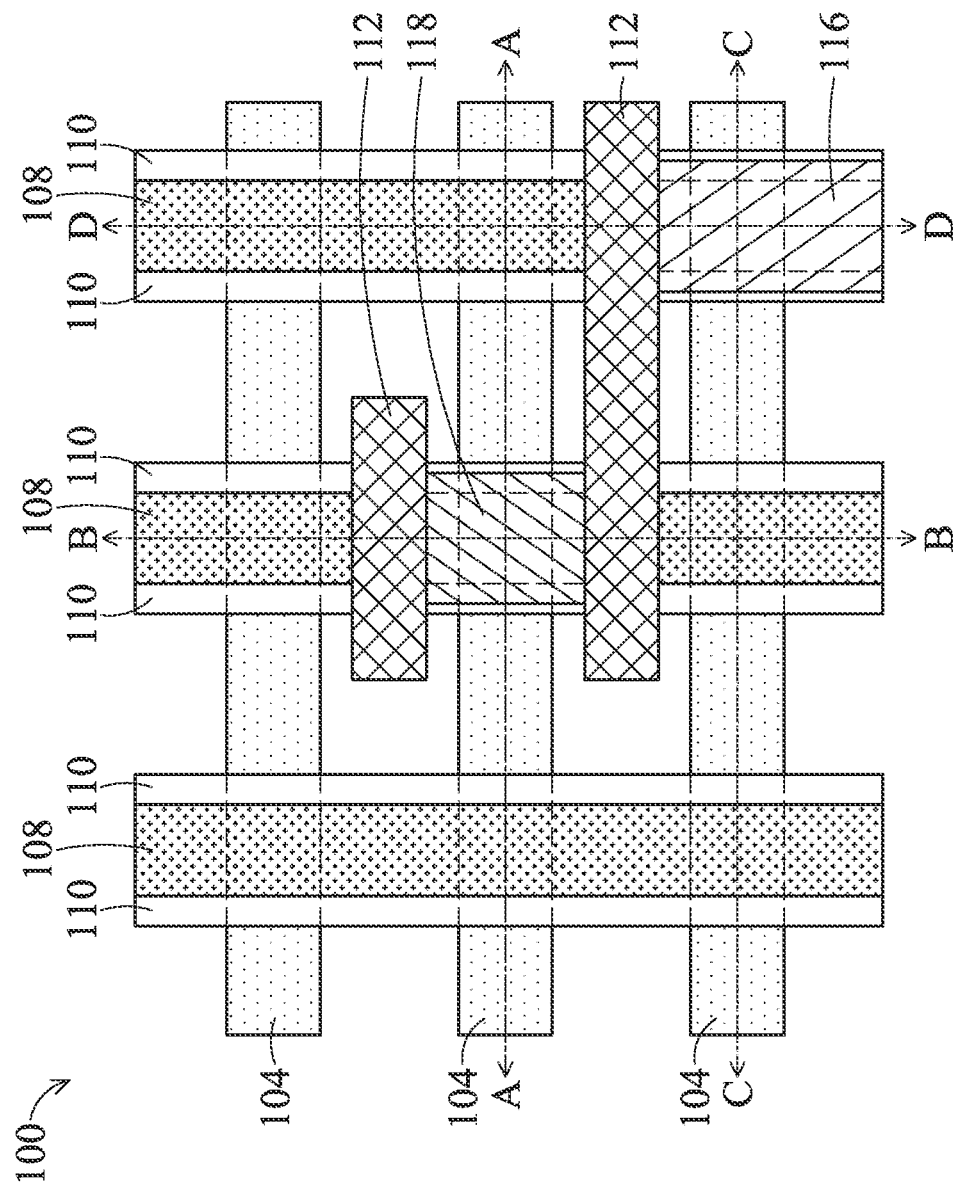
FIG. 1 illustrates a simplified top-down layout view of a multi-gate device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below,"

"beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on all-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Transistors require power for proper functioning. On a substrate, power may be distributed by a network made of conductive materials, such as metal lines and vias. The power distribution network is also referred to as power rails. Power rails provide one or more conductive paths arranged between transistors and a voltage domain. A voltage domain can provide a reference voltage by virtue of being connected to a power supply. As the integrated circuits continue to scale down, so do the power rails. Voltage drop across the power rails often increases, which in turn increases power consumption of the integrated circuits.

An extra power rail may be provided on the backside of a substrate in addition to the power rail on the frontside of the substrate. This increases the number of metal tracks available in the structure for direct connection to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance.

To electrically connect a frontside power rail and a backside power rail, power taps (also referred to as power vias) may be used, which extend through a substrate and provide electrical connection between the frontside power rail and backside power rail. However, adding power taps to a circuit layout increases routing complexity and reduces available layout area to host other features.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and related methods for converting existing device features, such as continuous-poly-on-diffusion-edge (CPODE) features, to power taps for electrically connection between the frontside and backside power rails. By using existing device features as power taps, no layout area penalty occurs in order to host extra power taps and routing complexity is reduced.

Continuing to provide the desired scaling and increased density for multi-gate devices in advanced technology nodes calls for scaling of the contacted poly pitch (CPP) (or "gate pitch"). In at least some implementations, a continuous-poly-on diffusion-edge (CPODE) process is used to scale the CPP. For purposes of this disclosure, a "diffusion edge" may be equivalently referred to as an active edge, where for example an active edge abuts adjacent active regions. Further, an active region includes a region where transistor structures are formed (e.g., including source, drain, and gate/channel structures). In some examples, active regions may be disposed between insulating regions. The CPODE process may provide an isolation region between neighboring active regions, and thus neighboring transistors, by performing a dry etching process along an active edge (e.g., at a boundary of adjacent active regions) to form a cut region and filling the cut region with a dielectric material, such as silicon nitride (SiN).

Before the CPODE process, the active edge may include a dummy GAA structure having a gate stack and a plurality of channels (or referred to as channel layers, such as nanowire/nanosheet channel layers). The plurality of channels may each include a chemical oxide layer formed thereon, and high-k dielectric/metal gate layers may be formed over the chemical oxide layer and between adjacent channels of the plurality of channels. In addition, inner spacers may be disposed between adjacent channels at lateral ends of the plurality of channels. In various examples, source/drain epitaxial (epi) layers of adjacent active regions are disposed on either side of the dummy GAA structure (formed at the active edge), such that the adjacent source/drain epi layers are in contact with the inner spacers and plurality of channels of the dummy GAA structure. The subsequent CPODE etching process removes the metal gate layer and the channels from the dummy GAA structure to form a CPODE trench. However, instead of filling the CPODE trench with a dielectric material, a conductive material is deposited in the CPODE trench to form a conductive feature extending deep into the substrate. A backside thinning process is subsequently performed to expose the conductive feature from the backside of the substrate. The frontside and backside power rails are then formed with the conductive feature stacked therebetween and connecting the frontside and backside power rails. The conductive feature replaces a traditional dielectric CPODE feature and functions as a power tap between the frontside and backside power rails instead. As to be explained in further detail below, the CPODE etching process is self-aligned. By employing the disclosed CPODE process, a power tap formation window is enlarged and device performance and reliability of transistors formed in the adjacent active regions will be enhanced. Other embodiments and advantages will be evident to those skilled in the art upon reading the present disclosure.

For purposes of the discussion that follows, FIG. 1 provides a simplified top-down layout view of an intermediate structure in forming a multi-gate device 100, according to some embodiments. In various embodiments, the multi-gate device 100 may include a FinFET device, a GAA transistor, or other type of multi-gate device. The multi-gate device 100 may include a plurality of fin-shape elements (or referred to as fins) 104 extending from a substrate, a plurality of gate structures 108 disposed over and around the fin-shape elements 104, and a gate spacer layer 110 disposed on sidewalls of each gate structure 108. The multi-gate device 100 may include a plurality of cut-metal gate (CMG) features 112 dividing one or more gate structures 108 into segments. FIG. 1 further illustrates two different CPODE features formed in CPODE trenches. One is a dielectric CPODE feature 116 dividing one of the fins 104 in two, another is a conductive CPODE feature 118 intersecting the CMG features 112 and functioning as a power tap electrically connecting frontside and backside power rails.

Although three fins 104 are illustrated in FIG. 1 and in the following figures, it is understood that depending on the desired design and the number of multi-gate transistors, any suitable number of fins 104 may be formed in the multi-gate device 100. Furthermore, any suitable number of gate structures 108, CMG features 112, dielectric CPODE features 116, and conductive CPODE features 118 may be formed to implement the desired multi-gate device 100.

FIG. 1 further illustrates a first cutline (A-A), a second cutline (B-B), a third cutline (C-C), and a fourth cutline (D-D) taken through the intermediate structure. The first cutline (A-A) is taken through the length of one of the fins 104 divided in two and through the conductive CPODE feature 118. The second cutline (B-B) is taken through the length of one of the gate structures 108 separated by the two CMG features 112, through the two CMG features 112, and through the conductive CPODE feature 118 intersecting the two CMG features 112. The third cutline (C-C) is taken through the length of another fin 104 divided in two and through the dielectric CPODE feature 116. The fourth cutline (D-D) is taken through the length of another gate structure 108 separated by one of the CMG features 112, through the dielectric CPODE feature 116 and through one of the CMG features 112. Channel regions of the multi-gate device 100, which may include a plurality of semiconductor channel layers (e.g., when the multi-gate device 100 includes GAA transistors), are disposed within the fins 104, underlying the gate structures 108, along a plane substantially parallel to a plane defined by the first cutline (A-A) of FIG. 1. Various other features of the multi-gate device 100 are discussed in more detail below with reference to the method of FIG. 2.

Figure 2:
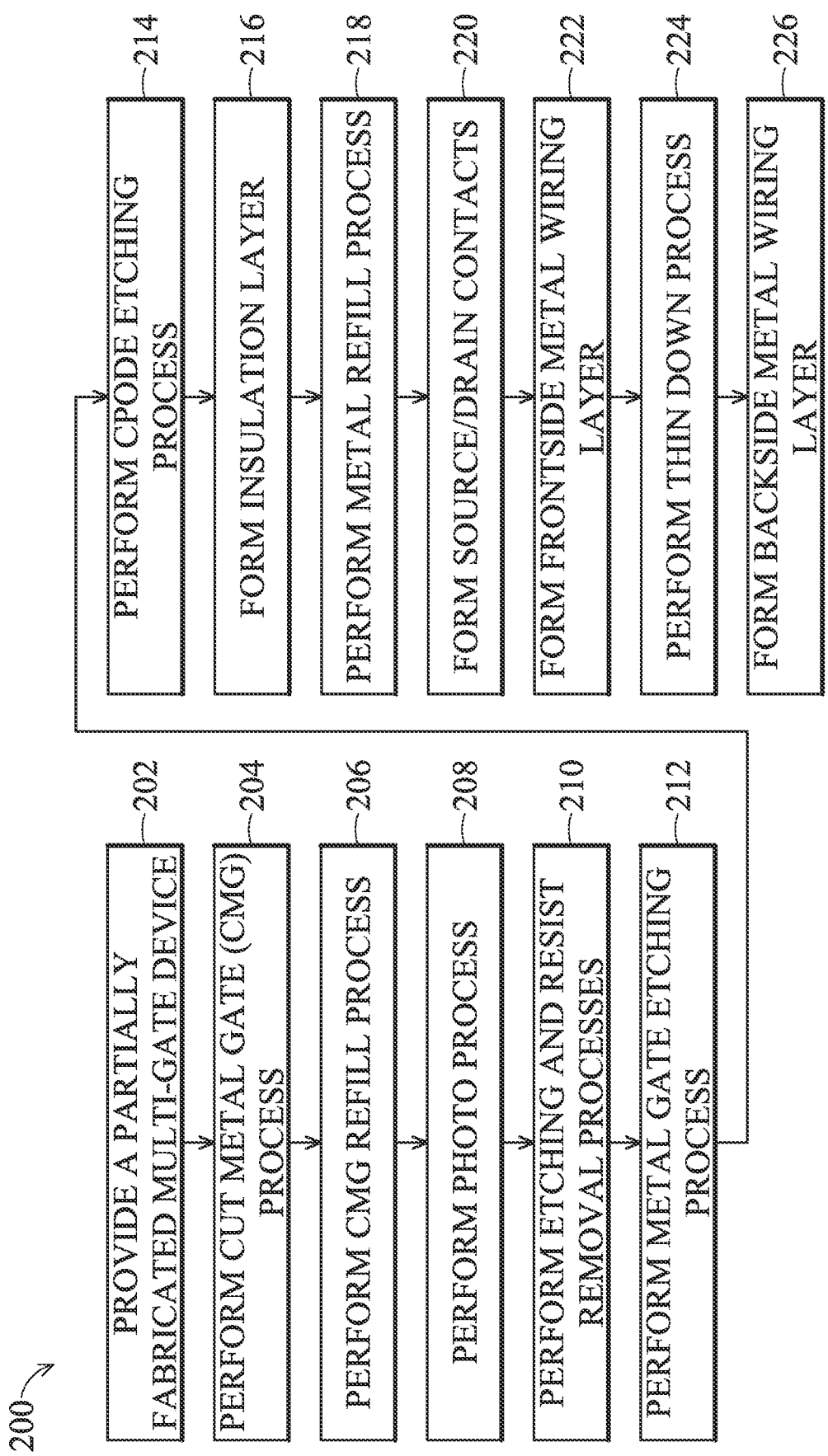
FIG. 2 is a flow chart of a method of fabricating a multi-gate device, according to one or more aspects of the present disclosure.

Referring to FIG. 2, illustrated therein is a method 200 of fabrication of a semiconductor device (or device) 300 (e.g., which includes a multi-gate device) using a CPODE process, in accordance with various embodiments. The method 200 is discussed below with reference to a GAA device having a channel region that may be referred to as a nanosheet and which may include various geometries (e.g., cylindrical, bar-shaped) and dimensions. However, it will be understood that aspects of the method 200, including the disclosed CPODE process, may be equally applied to other types of multi-gate devices (e.g., such as FinFETs or devices including both GAA devices and FinFETs) without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

Figures 23A, 23B:
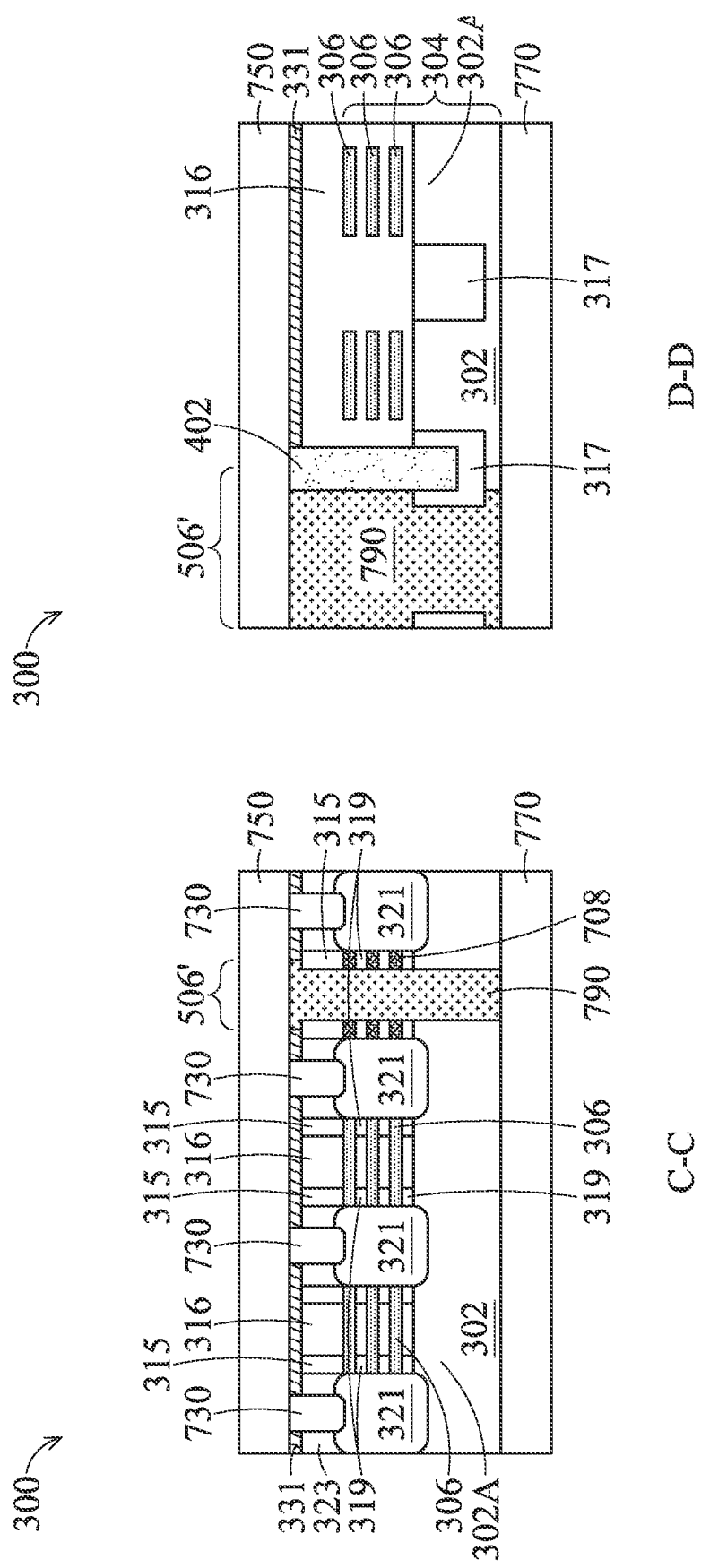
FIGS. 23A and 24A provide cross-sectional views of an embodiment of a semiconductor device along a plane substantially parallel to a plane defined by a cutline C-C of FIG. 1 at various stages of the method of FIG. 2, according to one or more aspects of the present disclosure.
FIGS. 23B and 24B provide cross-sectional views of an embodiment of a semiconductor device along a plane substantially parallel to a plane defined by a cutline D-D of FIG. 1 at various stages of the method of FIG. 2, according to one or more aspects of the present disclosure.
Figures 24A, 24B:
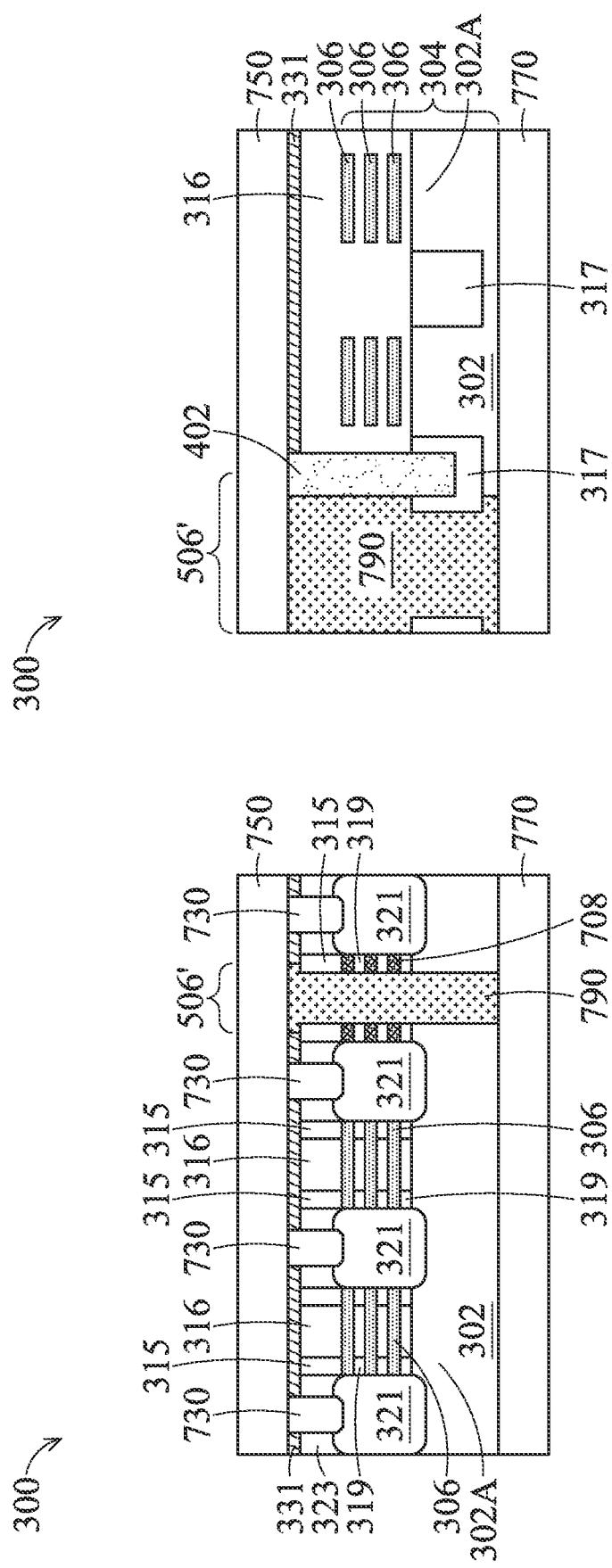

The method 200 is described below with reference to FIGS. 3A-23B which illustrate the device 300 at various stages of fabrication according to the method 200. The device 300 may be substantially similar to the device 100 in some embodiments. FIGS. 3A, 4A, 5A, 6A, 7A, 8A, 9A, 10A, 11A, 12A, 13A, 14A, 15A, 16A, 17A, 18A, 19A, 20A, 21A, and 22A provide cross-sectional views of the device 300 along the first cutline (A-A) of FIG. 1. FIGS. 3B, 4B, 5B, 6B, 7B, 8B, 9B, 10B, 11B, 12B, 13B, 14B, 15B, 16B, 17B, 18B, 19B, 20B, 21B, and 22B provide cross-sectional views of the device 300 along the second cutline (B-B) of FIG. 1. FIGS. 23A and 24A provide cross-sectional views of the device 300 along the third cutline (C-C) of FIG. 1. FIGS. 23B and 24B provide cross-sectional views of the device 300 along the fourth cutline (D-D) of FIG. 1.

Further, the device 300 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the device 300 includes a plurality of semiconductor devices (e.g., transistors), including PFETs, NFETs, etc., which may be interconnected. Moreover, it is noted that the process steps of method 200, including any descriptions given with reference to the figures are merely exemplary and are not intended to be limiting beyond what is specifically recited in the claims that follow.

The method 200 begins at block 202 (FIG. 2) where a partially fabricated multi-gate device is provided. Referring to FIGS. 3A and 3B, in an embodiment of block 202, a device 300 includes a first active region 303, a second active region 305, and an active edge 307 that is defined at a boundary of the first active region 303 and the second active region 305. In some embodiments, the first active region 303 includes a first GAA device 309, the second active region 305 includes a second GAA device 311, and the active edge 307 includes a dummy GAA structure 313, as described below. In accordance with embodiments of the present disclosure, a CPODE process may provide an isolation region between the first active region 303 and the second active region 305, and thus between the first and second GAA devices 309, 311, by performing a CPODE etching process along the active edge 307 to form a cut region and filling the cut region with an isolation layer and a conductive bulk material surrounded by the isolation layer to form a power tap, as described in more detail below.

Each of the first GAA device 309, the second GAA device 311, and the dummy GAA structure 313 are formed on a substrate 302 having fin-like structures 304. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epi layer, may be strained for performance enhancement, may include a silicon-on-insulator (SOI) structure, and/or have other suitable enhancement features.

The fin-like structures 304 may include a substrate portion 302A formed from the substrate 302 and nanosheet channel layers 306 above the substrate portion 302A. In some embodiments, the nanosheet channel layers 306 may include silicon (Si). However, in some embodiments, the nanosheet channel layers 306 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, the nanosheet channel layers 306 may be epitaxially grown by a molecular beam epitaxy (MBE) process, a metalorganic chemical vapor deposition (MOCVD) process, and/or other suitable epitaxial growth processes. In some embodiments, a vertical spacing between adjacent nanosheet channel layers 306 is about 4 nm to about 8 nm.

It is noted that while the fin-like structures 304 are illustrated as including three (3) nanosheet channel layers 306, this is for illustrative purposes only and is not intended to be limiting beyond what is specifically recited in the claims. It can be appreciated that any number of nanosheet channel layers 306 can be formed, where for example, the number of nanosheet channel layers 306 depends on the desired number of channels for the GAA device (e.g., the device 300). In some embodiments, the number of nanosheet channel layers 306 is between 2 and 10.

Shallow trench isolation (STI) features 317 may also be formed interposing the fin-like structures 304. In some embodiments, the STI features 317 include $SiO_2$, silicon nitride, silicon oxynitride, fluorine-doped silicate glass (FSG), a low-k dielectric, combinations thereof, and/or other suitable materials known in the art. In various examples, the dielectric layer used to form the STI features 317 may be deposited by a CVD process, a subatmospheric CVD (SACVD) process, a flowable CVD process, an ALD process, a PVD process, and/or other suitable process.

In various examples, each of the first GAA device 309, the second GAA device 311, and the dummy GAA structure 313 of the device 300 further includes a gate structure 316, which may include a high-k/metal gate stack. In some embodiments, the gate structure 316 may form the gate associated with the multi-channels provided by the nanosheet channel layers 306 in the channel region of the first GAA device 309 and the second GAA device 311. The gate structure 316 may include a gate dielectric layer (which is better illustrated as feature 318 in FIG. 12A) that further includes an interfacial layer and a high-k dielectric layer formed over the interfacial layer. In some embodiments, the gate dielectric layer has a total thickness between about 1 nm and about 5 nm. High-k dielectrics, as used and described herein, include dielectric materials having a high dielectric constant, for example, greater than that of thermal silicon oxide (~3.9). In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. In some examples, the interfacial layer includes the chemical oxide layer, discussed above. The high-k dielectric layer may include a high-k dielectric material such as hafnium oxide ($HfO_2$). Alternatively, the high-k dielectric layer may include other high-k dielectric materials, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-k dielectric layer may be formed by ALD, physical vapor deposition (PVD), CVD, oxidation, and/or other suitable methods.

The gate structure 316 may further include a metal electrode having a metal layer formed over the gate dielectric layer (e.g. over the interfacial layer and the high-k dielectric layer). The metal electrode may include a metal, metal alloy, or metal silicide. The metal electrode may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer may be formed by ALD, PVD, CVD, e-beam evaporation, or other suitable process. Further, the metal layer may be formed separately for N-type and P-type transistors which may use different metal layers. In addition, the metal layer may provide an N-type or P-type work function, may serve as a transistor gate electrode, and in at least some embodiments, the metal layer may include a polysilicon layer. The gate structure 316 includes portions that wrap around each of the nanosheet channel layers 306 of the fin-like structures 304, where the nanosheet channel layers 306 each provide semiconductor channel layers for the first GAA device 309 and the second GAA device 311.

In some embodiments, a gate spacer layer 315 may be formed on sidewalls of a top portion of the gate structure 316 of each of the first GAA device 309, the second GAA device 311, and the dummy GAA structure 313. The gate spacer layer 315 may be formed prior to formation of the high-k/metal gate stack of the gate structure 316. For example, in some cases, the gate spacer layer 315 may be formed on sidewalls of a previously formed dummy (sacrificial) gate stack that is removed and replaced by the high-k/metal gate stack, described above, as part of a replacement gate (gate-last) process. In some cases, the gate spacer layer 315 may have a thickness of about 2-10 nm. In various embodiments, the thickness of the gate spacer layer 315 may be selected to provide a desired sidewall profile following a subsequent CPODE etching process, as discussed in more detail below. In some examples, the gate spacer layer 315 may include a dielectric material such as silicon oxide, silicon nitride, silicon carbide, silicon oxynitride, SiCN, silicon oxycarbide, SiOCN, SiOHCN, a low-k material (e.g., with a dielectric constant less than about 3.9), and/or combinations thereof. In some embodiments, the gate spacer layer 315 includes multiple layers, such as main spacer layers, liner layers, and the like.

In various examples, each of the first GAA device 309, the second GAA device 311, and the dummy GAA structure 313 of the device 300 further includes inner spacers 319. The inner spacers 319 may be disposed between adjacent channels of the nanosheet channel layers 306, at lateral ends of the nanosheet channel layers 306, and in contact with portions of the gate structure 316 that interpose each of the nano sheet channel layers 306. In some examples, the inner spacers 319 may include silicon oxide, silicon nitride, silicon carbide, silicon oxynitride, SiCN, silicon oxycarbide, SiOCN, a low-k material, and/or combinations thereof. In various examples, the inner spacers 319 may extend beneath the gate spacer layer 315, described above, while abutting adjacent source/drain features 321, described below.

In some embodiments, source/drain features 321 are formed in source/drain regions adjacent to and on either side of the gate structure 316 of each of the first GAA device 309 and the second GAA device 311 and over the substrate portion 302A. As a result, the dummy GAA structure 313 is disposed between a first source/drain feature 321 of the first GAA device 309 (in the first active region 303) and a second source/drain feature 321 of the second GAA device 311 (in the second active region 305). As shown, the source/drain features 321 of the first GAA device 309 are in contact with the inner spacers 319 and the nanosheet channel layers 306 of the first GAA device 309, and the source/drain features 321 of the second GAA device 311 are in contact with the inner spacers 319 and the nanosheet channel layers 306 of the second GAA device 311. Moreover, the source/drain features 321 (of the first and second GAA devices 309, 311) disposed on either side of the dummy GAA structure 313 are in contact with the inner spacers 319 and the nanosheet channel layers 306 of the dummy GAA structure 313.

In various examples, the source/drain features 321 include semiconductor epi layers such as Ge, Si, GaAs, AlGaAs, SiGe, GaAsP, SiP, or other suitable material, which may be formed by one or more epitaxial processes. In some embodiments, the source/drain features 321 may be in-situ doped during the epi process. For example, in some embodiments, epitaxially grown SiGe source/drain features may be doped with boron. In some cases, epitaxially grown Si source/drain features may be doped with carbon to form Si:C source/drain features, phosphorous to form Si:P source/drain features, or both carbon and phosphorous to form SiCP source/drain features. In some embodiments, the source/drain features 321 are not in-situ doped, and instead an implantation process is performed to dope the source/drain features 321. In some embodiments, formation of the source/drain features 321 may be performed in separate processing sequences for each of N-type and P-type source/drain features.

An inter-layer dielectric (ILD) layer 323 may also be formed over the device 300. In some embodiments, a contact etch stop layer (CESL) (not shown) is formed over the device 300 prior to forming the ILD layer 323. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 323 includes materials such as tetraethylorthosilicate (TEOS) oxide, un-doped silicate glass, or doped silicon oxide such as borophosphosilicate glass (BPSG), FSG, phosphosilicate glass (PSG), boron doped silicon glass (BSG), and/or other suitable dielectric materials. The ILD layer 323 may be deposited by a PECVD process or other suitable deposition technique. In some embodiments, after depositing the ILD layer 323, a planarization process, such as a chemical mechanical polishing (CMP) process, may be performed to remove excess material and planarize a top surface of the device 300.

In some embodiments, an etch stop layer (ESL) 331 is blanket deposited over the planar surface of the device 300. Any suitable material or composition may be used in forming the ESL 331. In some examples, the ESL 331 may comprise aluminum oxide (AlOx) with a thickness of about 10 Å to about 200 Å. Alternatively, the ESL 331 may comprise other materials and dimensions. In some examples, the ESL 331 may comprise nitrogen-doped carbide (NDC), oxygen-doped carbide (ODC), hydrogen and nitrogen doped carbide (HNDC), SiC, or tetraethyl orthosilicate (TEOS). In some examples, the ESL 331 is a metal layer including selectively grown tungsten (W). For example, the ESL 331 may include a fluorine free (FFW) layer providing reduced contact resistance.

In some embodiments, a hard mask layer 333 is formed over the ESL 331. Any suitable material or composition may be used in forming the hard mask layer 333, such as a tri-layer hard mask in one example. The example hard mask layer 333 includes a bottom layer, a middle layer, and a top layer (not shown), each with different or at least independent materials. The bottom layer may include tetraethyl orthosilicate (TEOS), a nitrogen free anti-reflective coating (NFAARC) film, oxygen-doped silicon carbide (ODC), silicon carbon nitride (SiCN), or plasma-enhanced oxide (PEOx); the middle layer may include a silicon rich polymer material (e.g., $SiC_xH_yO_z$); the top layer may include tetraethyl orthosilicate (TEOS) or silicon oxide. It is understood that in other embodiments, one or more layers may be omitted and that additional layers may be provided as a part of the tri-layer hard mask.

Figures 4A, 4B:
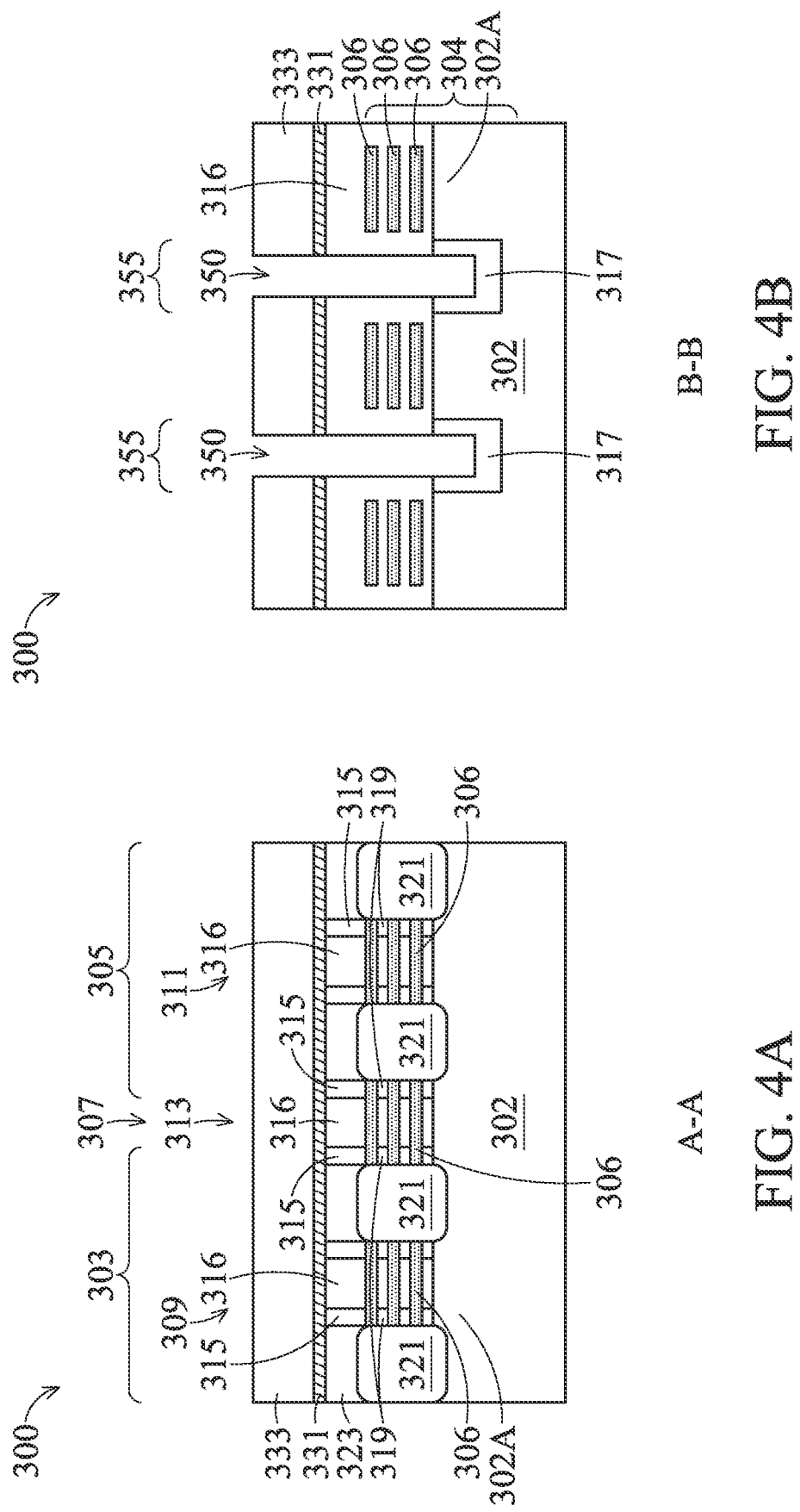
Figure 5A:
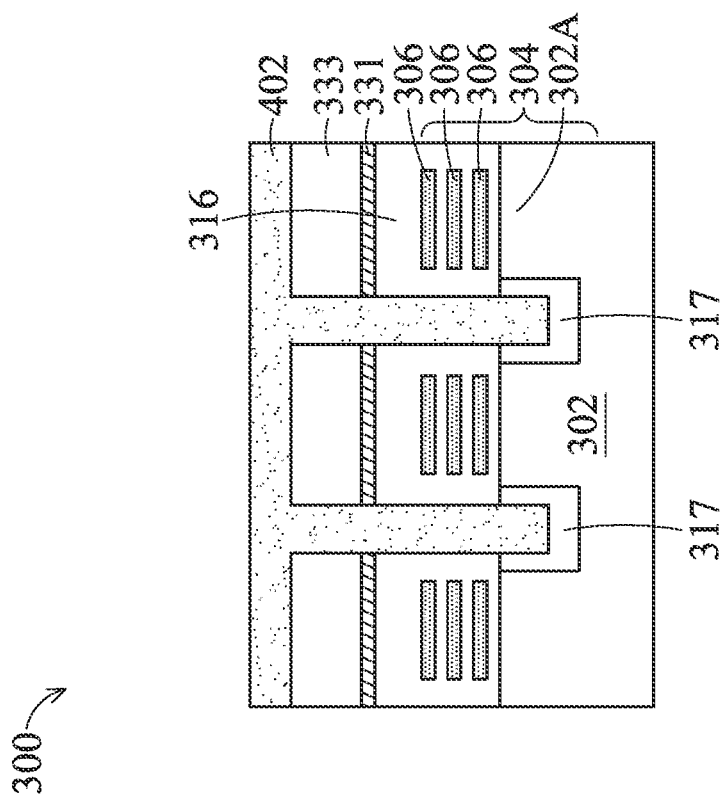
Figure 5B:
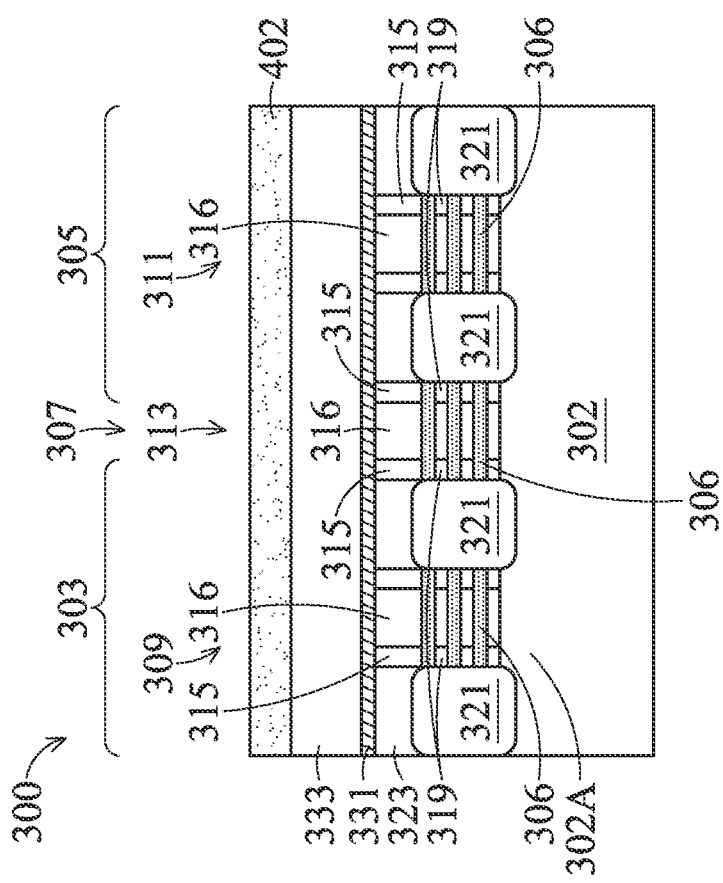

The method 200 then proceeds to block 204 (FIG. 2) where a cut metal gate (CMG) process is performed. With reference to FIGS. 4A and 4B, in an embodiment of block 204 and after forming the hard mask layer 333, a CMG process is performed to isolate the gate structures 316 of adjacent structures. By way of example, a photolithography and etch process may be performed to etch portions of the hard mask layer 333, and use the etched hard mask layer 333 as an etching mask to further etch the ESL 331, the metal layer and the gate dielectric layer of the gate structures 316, and a top portion of the STI features 317 to form trenches 350 in cut metal gate regions 355. In some embodiments, a bottom surface of the trenches 350 is below a top surface of the STI features 317. In various examples, the trenches 350 may be etched using a dry etch (e.g., reactive ion etching), a wet etch, or a combination thereof.

Figure 6B:
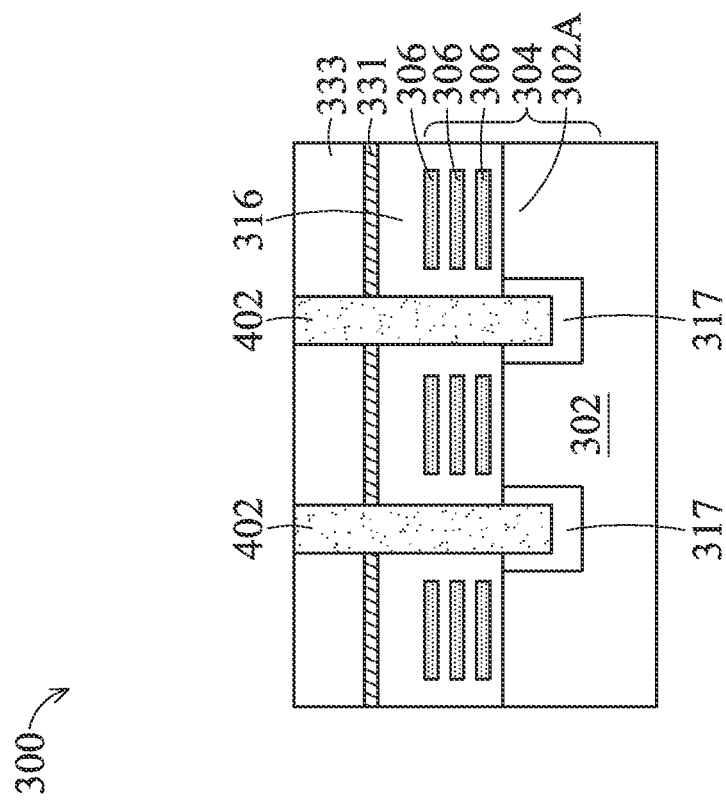
Figure 6A:
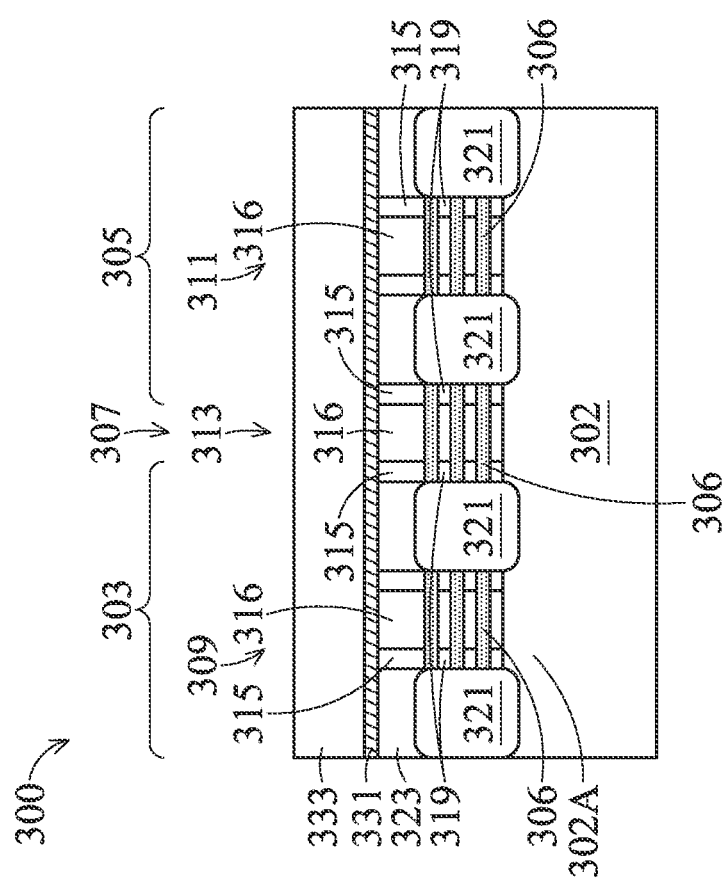

The method 200 then proceeds to block 206 (FIG. 2) where a CMG refill process is performed. With reference to FIGS. 5A-5B and 6A-6B, in an embodiment of block 206, a CMG refill process is used to form dielectric layer 402 over the device 300, including over the hard mask layer 333. The dielectric layer 402 also fills the previously formed trenches 350 and electrically isolate the gate structures 316 of adjacent structures. In some embodiments, the dielectric layer 402 is a nitride layer, such as including SiN. Alternatively, in some cases, the dielectric layer 402 may include $SiO_2$, silicon oxynitride, FSG, a low-k dielectric, combinations thereof, and/or other suitable materials known in the art. In various examples, the dielectric layer 402 may be deposited by a CVD process, an SACVD process, a flowable CVD process, an ALD process, a PVD process, and/or other suitable process. In some cases, after depositing the dielectric layer 402, a planarization process, such as a CMP process, may be performed to remove excess material and planarize a top surface of the device 300. The resultant structure after the CMP process is shown in FIGS. 6A-6B. The remaining portions of the dielectric 402 filling the trenches 350 are also referred to as CMG features 402.

The method 200 then proceeds to block 208 (FIG. 2) where a photolithography (photo) process is performed. With reference to FIGS. 7A and 7B, in an embodiment of block 208, a photoresist (resist) layer is deposited (e.g., using a spin-coating process) over the device 300 and patterned to form a patterned resist layer 502 that exposes a portion of the hard mask layer 333 located between the CMG features 402. In various embodiments, the photo process used to form the patterned resist layer 502 may also include other steps such as soft baking, mask aligning, exposure, post-exposure baking, developing, rinsing, drying (e.g., spin-drying and/or hard baking), other suitable lithography processes, and/or combinations thereof. In some embodiments, the photo process of block 208 may include a CPODE photo process, where the patterned resist layer 502 provides an opening 504 in a CPODE region 506 that exposes the portion of the hard mask layer 333. Due to the etching contrasts among various material layers, the etching process is self-aligned, such that the process window allows the opening 504 to be enlarged to counter overlaying inaccuracy. Thus, a portion of the top surfaces of the CMG features 402 may also be exposed in the opening 504. In addition, the CPODE region 506 may include the active edge 307 and the dummy GAA structure 313, discussed above with reference to FIG. 3A.

Figure 8A:
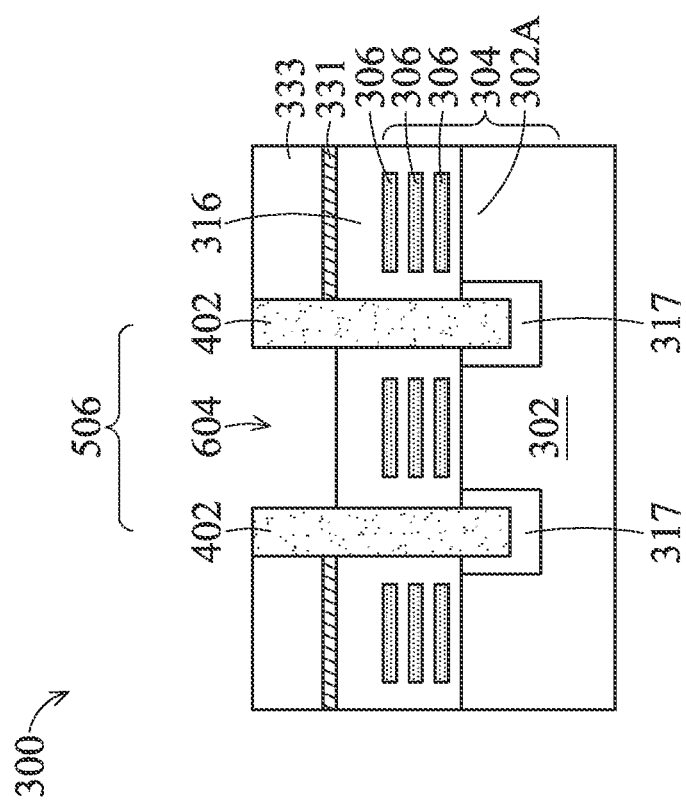
Figure 8B:
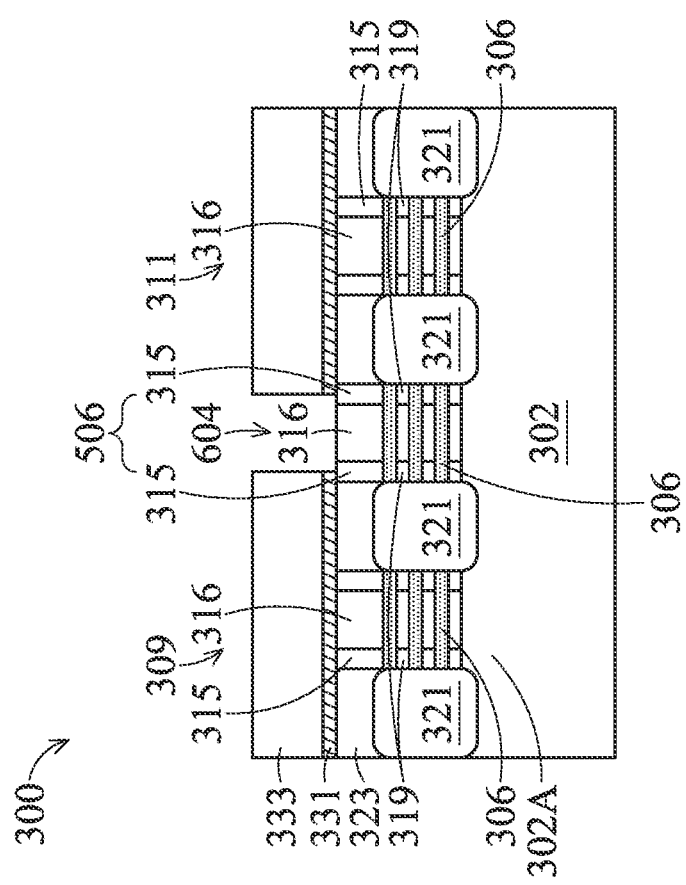

The method 200 then proceeds to block 210 (FIG. 2) where etching and resist removal processes are performed. With reference to FIGS. 8A and 8B, in an embodiment of block 210, an etching process is performed to remove portions of the hard mask layer 333 and the ESL 331 (e.g., in a region exposed by the opening 504 in the patterned resist layer 502) to form an opening 604. In various embodiments, the opening 604 formed by the etching process may expose a top surface of the gate structure 316 of the dummy GAA structure 313 and sidewalls of the CMG features 402 within the CPODE region 506. Due to the etching contrasts among various material layers, the etching process is self-aligned, such that the process window allows the opening 604 to be enlarged to counter overlaying inaccuracy. Thus, a portion of the top surfaces of the gate spacer layer 315 may also be exposed in the opening 604. In some examples, the etching process may include a dry etching process, a wet etching process, and/or a combination thereof. After the etching process, and in a further embodiment of block 210, the patterned resist layer 502 may be removed, for example, by way of a solvent, resist stripper, ashing, or other suitable technique.

The method 200 then proceeds to block 212 (FIG. 2) where a metal gate etching process is performed. With reference to FIGS. 9A and 9B, in an embodiment of block 212, the metal gate etching process includes removal of the gate structure 316 from the dummy GAA structure 313. The metal gate etching process may be performed through the opening 604. It is noted that the metal gate etching process may remove the gate structure 316 from a top portion of the dummy GAA structure 313, as well as between adjacent channels of the nanosheet channel layers 306. Thus, the opening 604 is extended downwardly to a top surface of the substrate portion 302A of the fin-like structure 304 and a top surface of the STI features 317. The nanosheet channel layers 306 and the inner spacers 319 are also exposed in the opening 604. In various embodiments, removal of the gate structure 316 may include a wet etching process. By way of example, the wet etching process may include a combination of ammonium hydroxide ($NH_4OH$), hydrogen peroxide ($H_2O_2$), and water ($H_2O$).

Figures 10A, 10B:
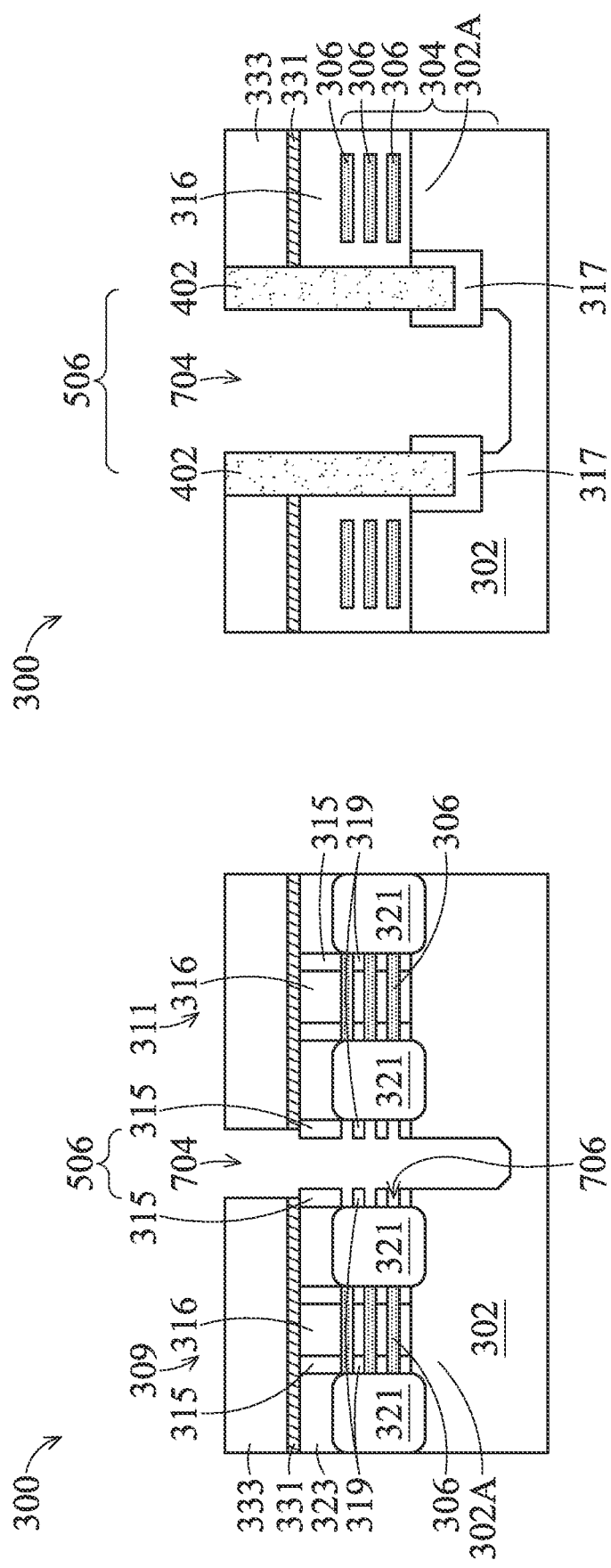
Figures 11A, 11B:
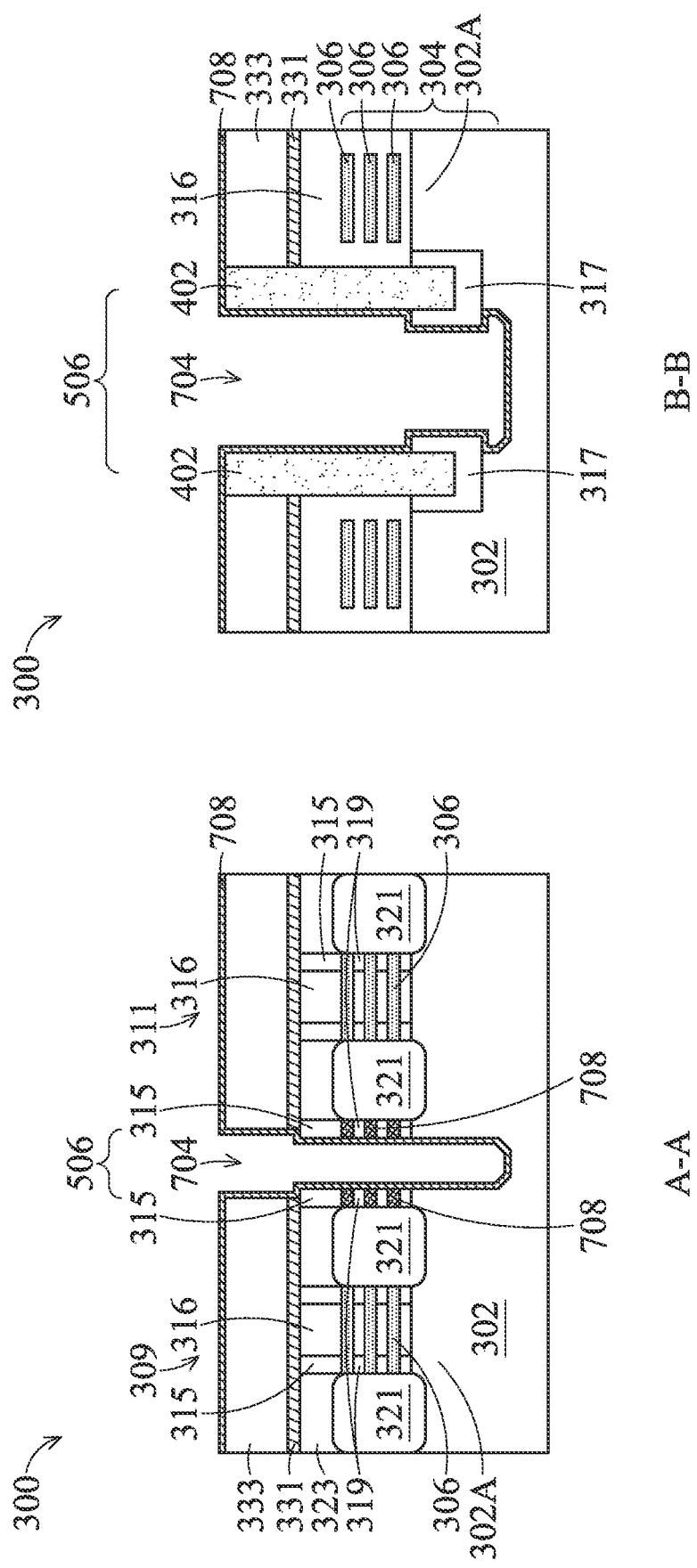

The method 200 then proceeds to block 214 (FIG. 2) where a CPODE etching process is performed. With reference to FIGS. 10A and 10B, in an embodiment of block 214, the CPODE etching process etches the device 300 through the opening 604 within the CPODE region 506 to form a trench 704. The trench 704 is also referred to as CPODE trench 704. In some cases, the CPODE etching process includes a dry etch (e.g., reactive ion etching), a wet etch, or a combination thereof. In some embodiments, the CPODE etching process removes the nanosheet channel layers 306 within the CPODE region 506 and removes the substrate portion 302A of the dummy GAA structure 313, such that the trench 704 extends into the substrate 302 and is below a bottom surface of the STI features 317. The removal of the nanosheet channel layers 306 forms cavities 706 between adjacent inner spacers 319. The cavities 706 connect to the trench 704. As a result, the source/drain features 321 are exposed in the cavities 706 after the removal of the nanosheet channel layers 306 in some embodiments. The etching contrasts among selected materials allow the gate spacer layer 315, the inner spacers 319, the CMG features 402, the source/drain features 321, and the STI features 317 remain substantially intact during the CPODE etching process in some embodiments. In one embodiment, the STI features 317 may include oxide and suffer some etching loss due to an selected etchant's limited etching contrast to oxide. Also depicted in FIG. 10B, although the etching contrasts confine the trench 704 between sidewalls of the CMG features 402 and the STI features 317, the trench 704 may extend laterally when it extends in a depth below the bottom surface of the STI features 317, particularly in a wet etching process. In the depicted embodiment, a portion of the trench 704 is directly under the STI features 317.

The method 200 then proceeds to block 216 (FIG. 2) where an insulation layer is formed in the trench 704. The insulation layer insulates the source/drain features 321 from the conductive power tap about to be formed in the trench 704 in subsequent metal refill process. With reference to FIGS. 11A-11B and 12A-12B, in some embodiments, a dielectric liner 708 is blanket deposited, covering top surfaces of the device 300, sidewalls and bottom surface of the trench 704, and filling the cavities 706. The dielectric liner 708 may include a dielectric material, such as SiN, SiOC, SiOCN, SiCN, $SiO_2$, and/or other suitable material. In some embodiments, the dielectric liner 708 is conformally deposited, for example, by ALD or any other suitable method. After the conformal deposition of the dielectric liner 708, an etch-back process is performed to partially remove the dielectric liner 708 from outside of the cavities 706. By this etching the dielectric liner 708 remains substantially within the cavities 706. The remaining portion of the dielectric material in the cavities 706 is also referred to as the dielectric spacers 708.

Figures 12A, 12B:
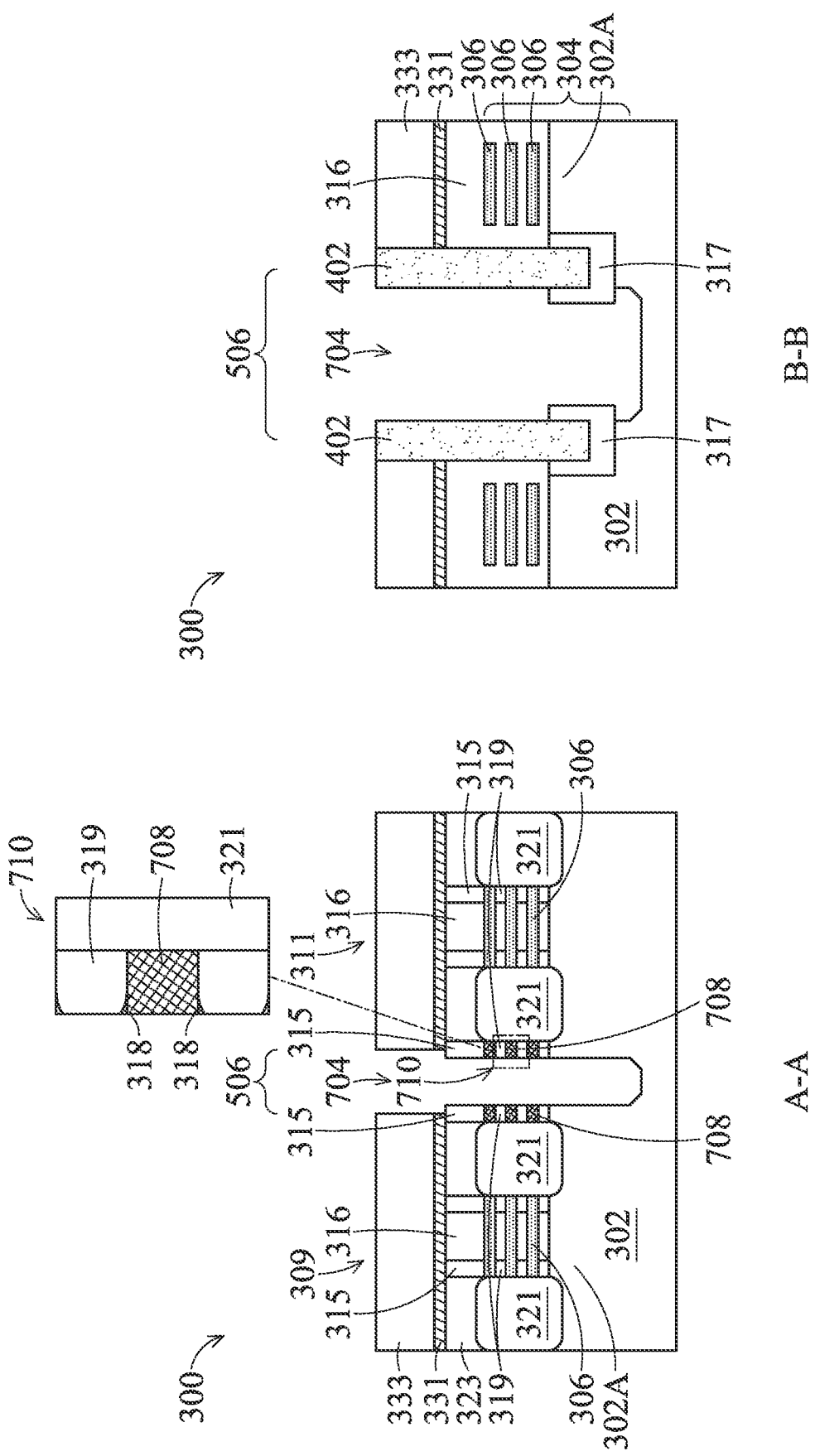

For clarity discussion, FIG. 12A includes an enlarged view of a region 710 between the trench 704 and a source/drain feature 321, as indicated by the dashed lines. The region 710 includes the dielectric spacers 708 and the inner spacers 319 alternatively stacked in a vertical direction. The region 710 further includes unremoved portions of the gate dielectric layer 318 filling cracks between the dielectric spacer 708 and the inner spacers 319. The dielectric spacers 708, the inner spacers 319, and the unremoved portions of the gate dielectric layer 318 collectively define an insulation layer covering the source/drain features 321 from exposing in the trench 704. In some embodiments, the dielectric spacers 708, the inner spacers 319, and the gate dielectric layer 318 include dielectric material compositions different from each other. In some embodiments, the dielectric spacers 708 and the inner spacers 319 include the same dielectric material composition and form a continuous dielectric layer.

In an alternative embodiment of block 216, the CPODE etching process at block 214 includes a dry etch and lateral ends of the nanosheet channel layers 306 protected by (disposed directly below) the gate spacer layer 315 remain, and block 216 includes a passivation process to convert the semiconductor material in the lateral ends of the nanosheet channel layers 306 to the dielectric spacers 708, instead of depositing and etching back a dielectric liner as discussed above. In one example, the passivation process is an oxidation process. The semiconductor material may be oxidized by an $O_3$ cleaning and converted to silicon oxide. In another example, the passivation process is a nitridation process. The semiconductor material may be nitrified by a nitrogen cleaning and converted to silicon nitride.

The method 200 then proceeds to block 218 (FIG. 2) where a metal refill process is performed. With reference to FIGS. 13A-13B and 14A-14B, in an embodiment of block 218, a refill process is used to form a conductive feature 720 over the device 300 and within the trench 704 formed by the CPODE etching process. The conductive feature 720 may be formed as a bulk metal layer by filling a conductive material in the trench 704. The conductive material may be deposited through suitable techniques such as an electro-chemical plating process, CVD, PVD, ALD, or other suitable methods. In one embodiment, the conductive feature 720 is formed by a damascene process and may include copper (Cu), although other suitable materials such as tungsten (W), cobalt (Co), Nickel (Ni), aluminum (Al), combinations thereof, and/or the like, may alternatively be utilized. After depositing the conductive material, excess conductive material may be removed using, for example, a planarization process, such as a CMP process, thereby leaving remaining portion of the conductive feature 720 in the trench 704. The CMP process may also remove the hard mask layer 333 until the ESL 331 is exposed. In other words, the ESL 331 may also function as a CMP stop layer. The resultant structure after the CMP process is shown in FIGS. 14A-14B. The remaining portions of the conductive feature 720 filling the trench 704 is also referred to as a conductive CPODE feature 720. The insulation layer comprising the dielectric spacers 708, the inner spacers 319, and the unremoved portions of the gate dielectric layer 318 isolates the conductive CPODE feature 720 from contacting the source/drain features 321. With reference to FIG. 14A, the insulation layer may have a thickness W1 ranging from about 3 nm to about 8 nm, the conductive CPODE feature 720 may have a thickness W2 (between opposing insulation layer) ranging from about 5 nm to about 20 nm, while a topmost portion (in the opening of the ESL 331) of the conductive CPODE feature 720 may be wider than W2 for about 1 nm to about 6 nm and in contact with a top surface of the gate spacer layer 315. With reference to FIG. 14B, a bottom portion of the conductive CPODE feature 720 may be wider than a spacing between two adjacent STI features 317 and in contact with a bottom surface of the STI features 317.

The method 200 then proceeds to block 220 (FIG. 2) where source/drain contacts are formed. With reference to FIGS. 15A and 15B, in an embodiment of block 220, source/drain contacts 730 are formed that extend through the ESL 331, the ILD layer 323, and the CESL (if presented). The formation of the source/drain contacts 730 includes, for example but is not limited to: performing one or more etching processes to form contact openings extending through the ESL 331, the ILD layer 323, and the CESL to expose source/drain features 321; depositing one or more metallic materials that overfill the contact openings; a CMP process is then performed to remove excess metal material located outside the contact openings. In some embodiments, the source/drain contacts 730 include a silicide feature disposed on the source/drain features 321, a conductive barrier layer, and a metal fill layer over the conductive barrier layer. In some embodiments, the silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes.

Figure 16B:
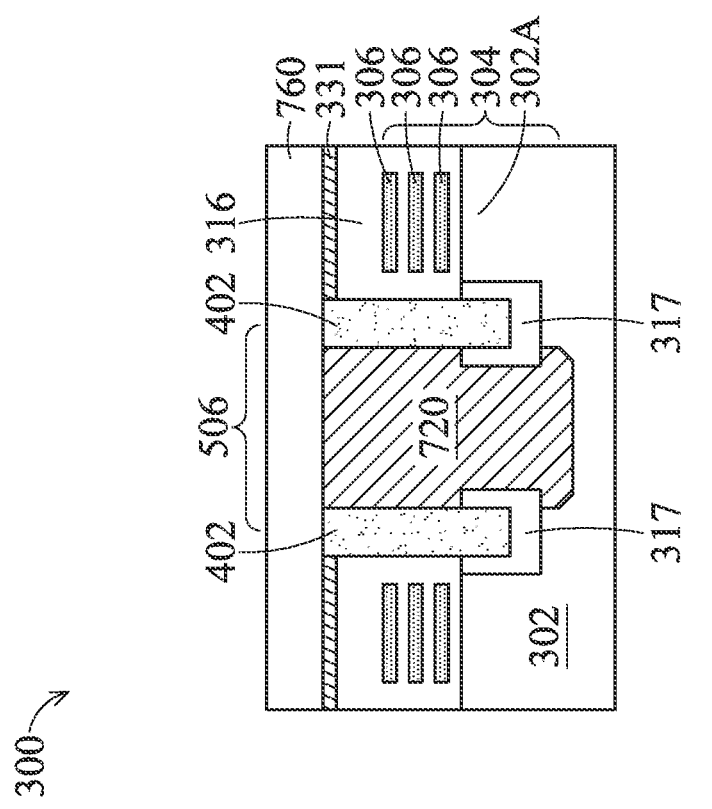
Figure 16A:
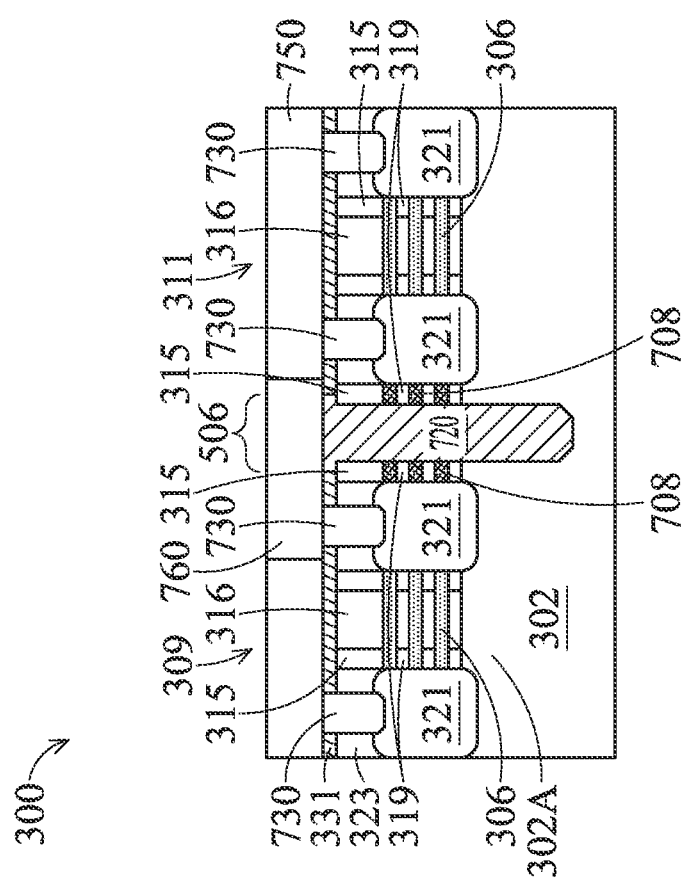

The method 200 then proceeds to block 222 (FIG. 2) where a frontside metal wiring layer is formed. With reference to FIGS. 16A and 16B, in an embodiment of block 222, the frontside metal wiring layer includes a second ILD layer 750 deposited on the device 300 and metal lines 760 formed in the second ILD layer 750. In some embodiments, the second ILD layer 750 is formed by depositing a dielectric material over the planar surfaces of the ESL 331, the source/drain contacts 730, and the conductive CPODE feature 720. The second ILD layer 750 may be formed and planarized using any of the processes and materials suitable for forming the ILD layer 323, as set forth above. Once the second ILD layer 750 is formed, metal lines 760 are formed through the second ILD layer 750 to provide electrical connectivity between the conductive CPODE feature 720 and one or more source/drain contacts 730. Any suitable masking and etching process may be used to form openings through the second ILD layer 750. Once the openings are formed, a conductive material, such as copper, may be deposited to fill and/or overfill the openings using a deposition process such as electro-chemical plating process, CVD, PVD, ALD, or other suitable methods. Excess material may then be removed using, for example, a planarization process, such as a CMP process or the like. The conductive material remaining in the openings forms the metal lines 760.

The method 200 then proceeds to block 224 (FIG. 2) where the device 300 is thinned down from its backside. With reference to FIGS. 17A and 17B, in an embodiment of block 224, the device 300 is thinned down until the conductive CPODE feature 720 is exposed from the backside of the device 300. In some embodiments, the thinning process may include a mechanical grinding process. A substantial amount of the substrate 302 is removed during a mechanical grinding process until the conductive CPODE feature 720 is exposed. In some embodiments, the thinning process includes a chemical thinning process. An etching chemical is applied to the backside of the substrate 302 to remove a substantial amount of the substrate 302 until the conductive CPODE feature 720 is exposed. The remaining portion of the conductive CPODE feature 720 has a height H ranging from about 100 nm to about 150 nm in some embodiments.

Figures 18A, 18B:
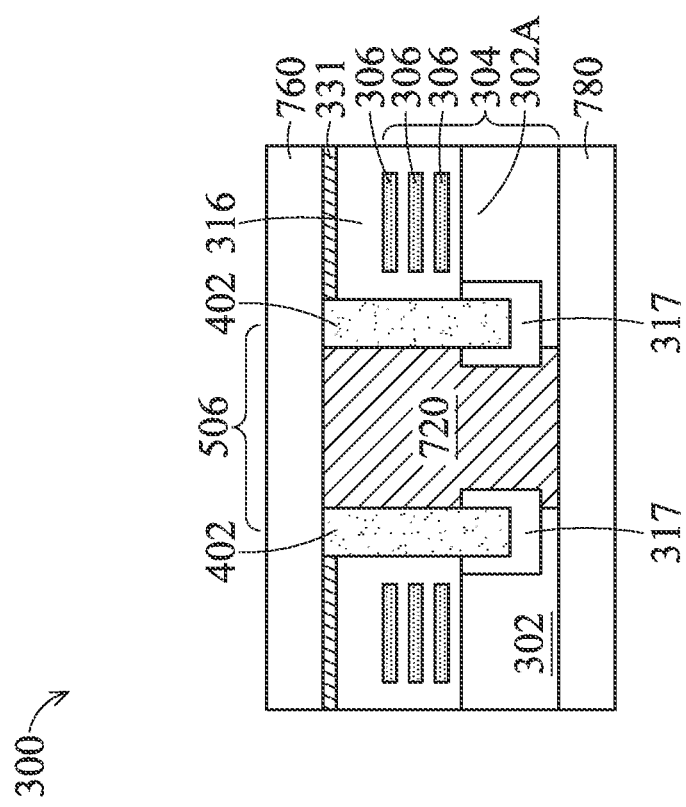

The method 200 then proceeds to block 226 (FIG. 2) where a backside metal wiring layer is formed. With reference to FIGS. 18A and 18B, in an embodiment of block 226, the backside metal wiring layer includes a backside dielectric layer 770 deposited on the backside of the device 300 and metal lines 780 formed in the backside dielectric layer 770. In some embodiments, the device 300 is attached to a carrier (not shown) and flipped upside down for the backside processing. The backside dielectric layer 770 is formed by depositing a dielectric material over the planar backside surface of the substrate 302 and the exposed bottom surface of conductive CPODE feature 720. The backside dielectric layer 770 may have a thickness ranging from about 20 nm to about 100 nm in some embodiments. Once the backside dielectric layer 770 is formed, metal lines 780 are formed through the backside dielectric layer 770 to have electrical connection with the conductive CPODE feature 720. The backside dielectric layer 770 may be formed and planarized using any of the processes and materials suitable for forming the ILD layer 323, as set forth above. Any suitable masking and etching process may be used to form openings through the backside dielectric layer 770. Once the openings are formed, a conductive material, such as copper (Cu), may be deposited to fill and/or overfill the openings using a deposition process such as electro-chemical plating process, CVD, PVD, ALD, or other suitable methods. Other conductive material, such as W, Ru, Mo, Co, or a combination thereof, may be used alternative to Cu. Excess material may then be removed using, for example, a planarization process such as chemical mechanical planarization, or the like. The conductive material remaining in the openings forms the backside metal lines 780. Through the conductive CPODE feature 720, the frontside metal wiring layer and the backside metal wiring layer are electrically connected. In some embodiments, the illustrated frontside metal wiring layer is part of a frontside power rail, and the illustrated backside metal wiring layer is part of a backside power rail. Thus, the conductive CPODE feature 720 is also referred to as a power tap. Due to the slot shape of the conductive CPODE feature 720 in a top view (e.g., feature 118 in FIG. 1), the conductive CPODE feature 720 may also be referred to as a power slot.

Figure 19B:
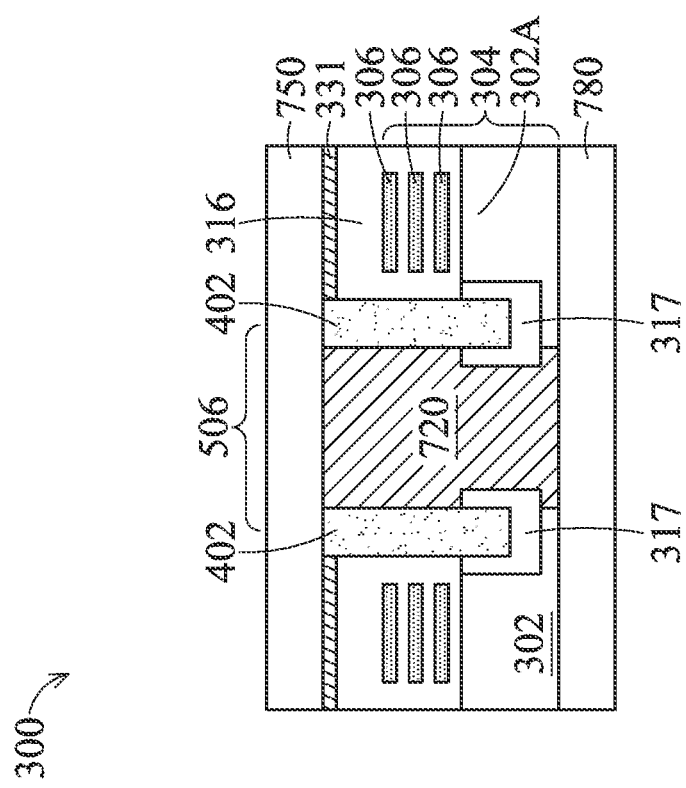
Figure 19A:
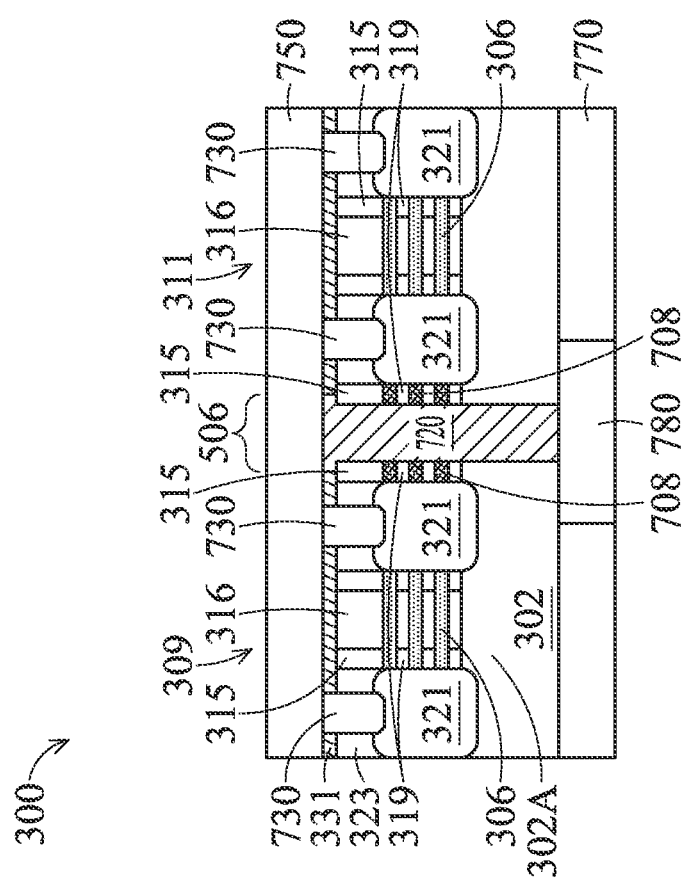

FIGS. 19A and 19B illustrate an alternative embodiment of the device 300 at the conclusion of block 226. One difference is that the conductive CPODE feature 720 may not be electrically connected to the source/drain feature 730. The conductive CPODE feature 720 may still connect to the frontside wiring layer elsewhere (not along the A-A cutline), or alternatively not even connected to the frontside wiring layer but serve to increase metal density or as heat dissipation sinks for the backside power rail.

Figures 20A, 20B:
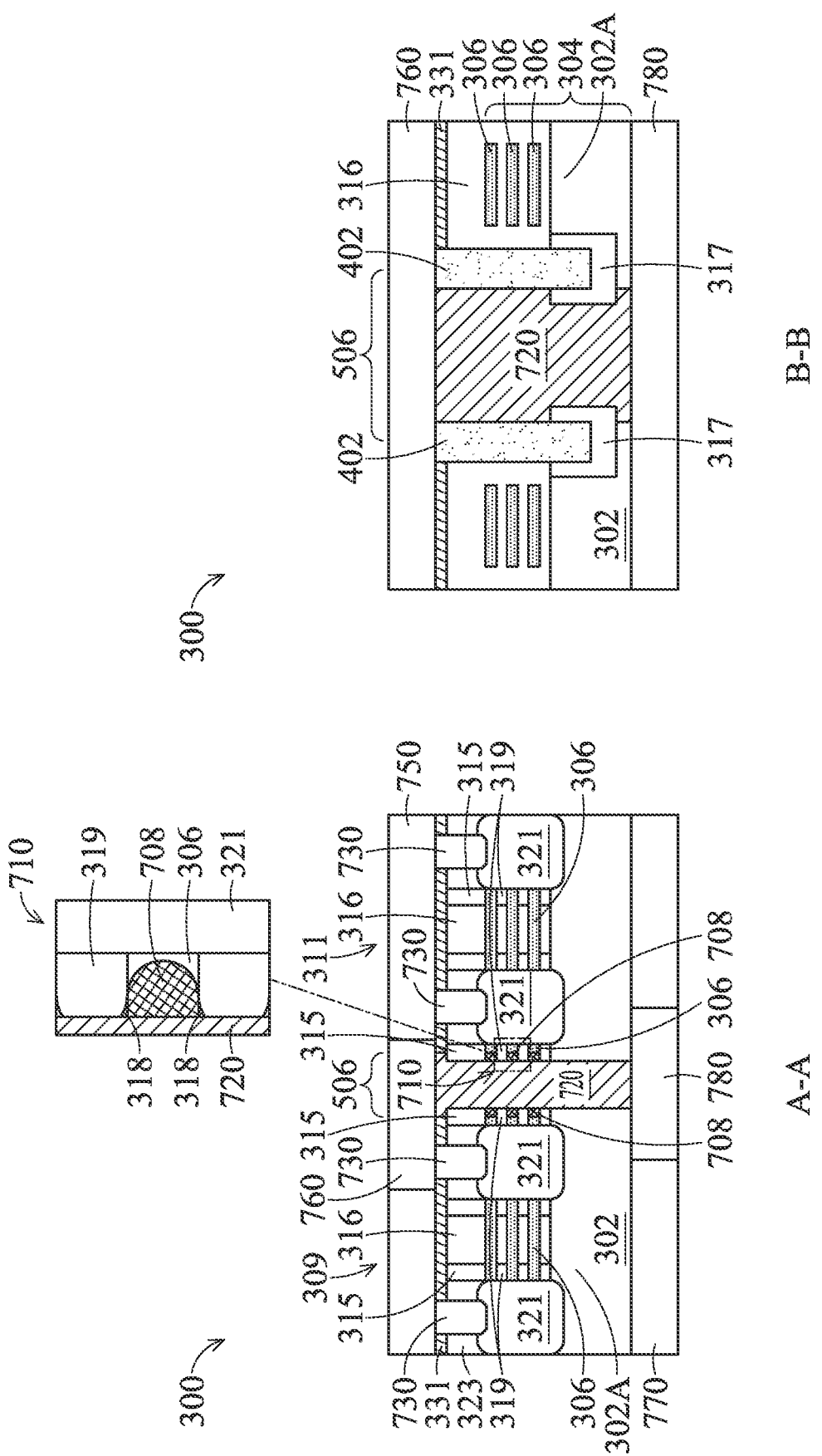

FIGS. 20A and 20B illustrate yet another alternative embodiment of the device 300 at the conclusion of block 226. For clarity discussion, FIG. 20A includes an enlarged view of the region 710 between the conductive CPODE feature 720 and a source/drain feature 321, as indicated by the dashed lines. One difference is that the lateral ends of the nanosheet channel layers 306 may not be fully removed during the CPODE etching process at block 214 or fully passivated during the passivation process at block 216, such that a portion of the lateral ends of the nano sheet channel layers 306 in contact with the source/drain features 321 is remained. The remaining portion of the nanosheet channel layers 306 is laterally stacked between the dielectric spacers 708 and the source/drain features 321 and separates the dielectric spacers 708 from contacting the source/drain features 321.

Figure 21B:
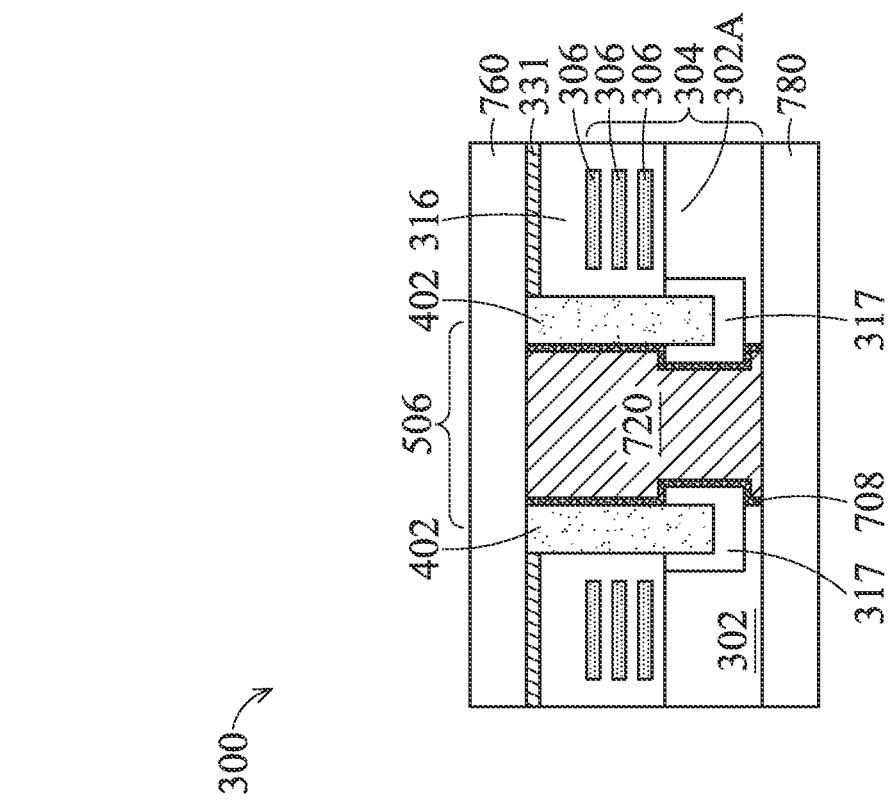
Figure 21A:
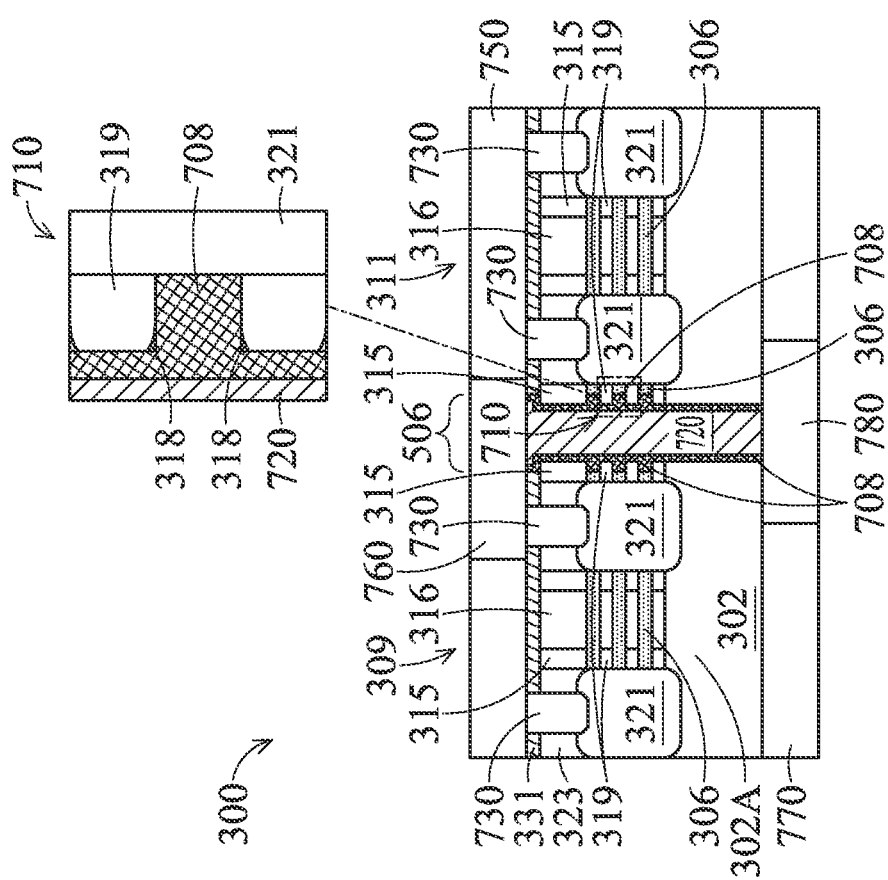

FIGS. 21A and 21B illustrate yet another alternative embodiment of the device 300 at the conclusion of block 226. For clarity discussion, FIG. 21A includes an enlarged view of the region 710 between the conductive CPODE feature 720 and a source/drain feature 321, as indicated by the dashed lines. One difference is that the etch-back process at block 216 in removing the dielectric liner 708 from the trench 704 may be skipped, such that the dielectric liner 708 remains. The dielectric liner 708 separates the inner spacers 319 and the unremoved portion of the gate dielectric layer 318 from contacting the conductive CPODE feature 720. With reference to FIG. 21B, the dielectric liner 708 also separates the conductive CPODE feature 720 from contacting the CMG features 402, the STI features 317, and the substrate 302.

Figure 22B:
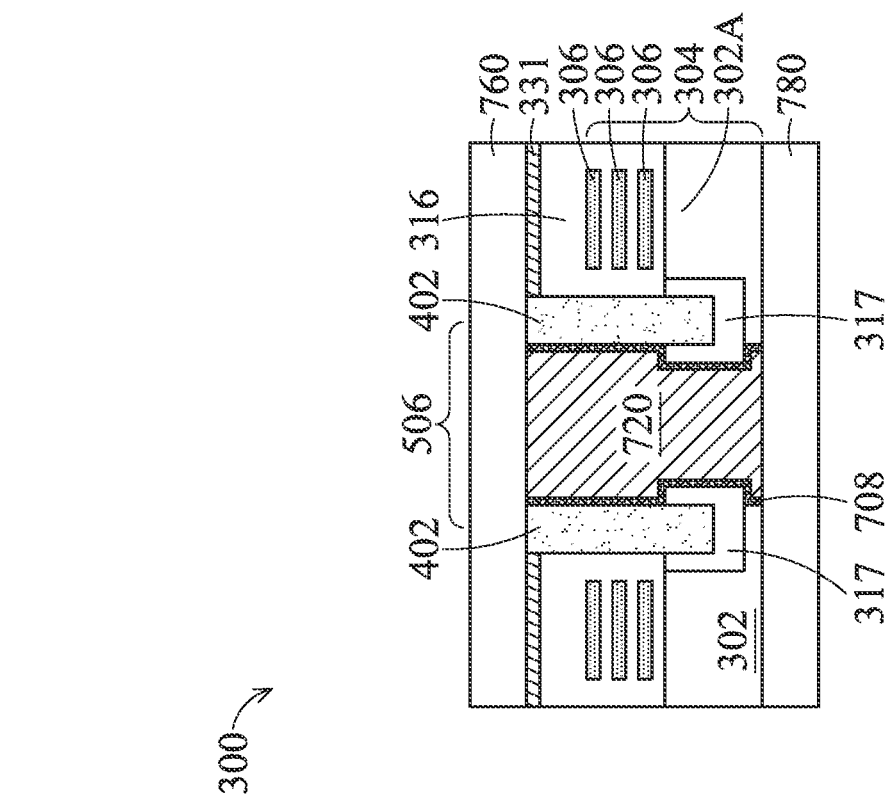
Figure 22A:
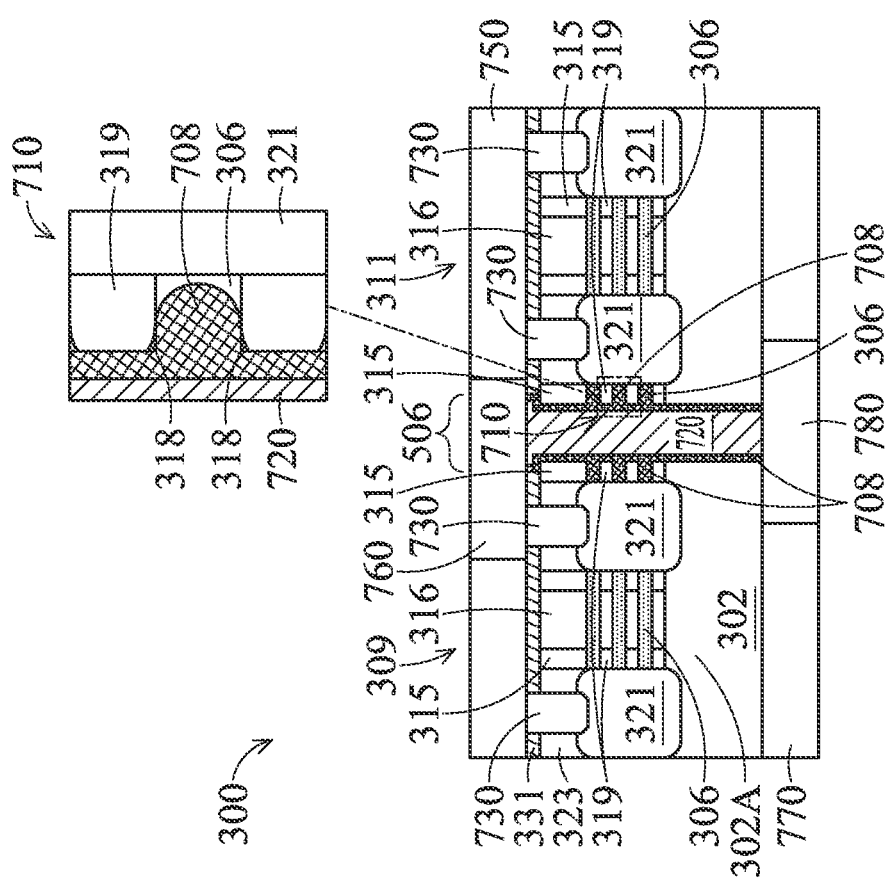

FIGS. 22A and 22B illustrate yet another alternative embodiment of the device 300 at the conclusion of block 226. For clarity discussion, FIG. 22A includes an enlarged view of the region 710 between the conductive CPODE feature 720 and a source/drain feature 321, as indicated by the dashed lines. One difference is that the lateral ends of the nanosheet channel layers 306 may not be fully removed during the CPODE etching process at block 214 or fully passivated during the passivation process at block 216, such that a portion of the lateral ends of the nano sheet channel layers 306 in contact with the source/drain features 321 is remained. The remaining portion of the nanosheet channel layers 306 is laterally stacked between the dielectric layer 708 and the source/drain features 321 and separates the dielectric layer 708 from contacting the source/drain features 321. Further, the etch-back process at block 216 in removing the dielectric liner 708 from the trench 704 may be skipped, such that the dielectric liner 708 remains. The dielectric liner 708 separates the inner spacers 319 and the unremoved portion of the gate dielectric layer 318 from contacting the conductive CPODE feature 720. With reference to FIG. 22B, the dielectric liner 708 also separates the conductive CPODE feature 720 from contacting the CMG features 402, the STI features 317, and the substrate 302.

By the CPODE process, it is not necessary to refill all the CPODE trenches with conductive material to form power taps. As shown in FIG. 1, some of the CPODE trenches may still be filled with dielectric material to form dielectric CPODE features, such as the illustrated dielectric CPODE feature 116. FIGS. 23A and 23B provide further detail of such an embodiment, which are cross-sectional views of the device 300 along the third cutline (C-C) and the fourth cutline (D-D) of FIG. 1. With reference to FIGS. 23A and 23B, after the CPODE trenches 704 are formed at block 214 and the insulation layer is formed at block 216, a separate refill process other than the metal refill process at block 218 may be performed to fill a CPODE trench 704 with a dielectric material to form a dielectric CPODE feature 790 in a CPODE region 506'. In some embodiments, the dielectric material includes SiN. Alternatively, in some cases, the dielectric material may include $SiO_2$, silicon oxynitride, FSG, a low-k dielectric, combinations thereof, and/or other suitable materials known in the art. In various examples, the dielectric material may be deposited by a CVD process, an SACVD process, a flowable CVD process, an ALD process, a PVD process, and/or other suitable process. In some cases, after depositing the dielectric material, a CMP process may be performed to remove excess material and planarize a top surface of the device 300, thereby forming the dielectric CPODE feature 790. The dielectric CPODE feature 790 provides a CPODE region 506' between the two active regions. Subsequently, the second ILD layer 750 and backside dielectric layer 770 are deposited on the frontside and backside of the device 300, respectively. Similar to the insulation layer abutting the conductive CPODE feature 720 discussed above, an insulation layer comprising the dielectric spacers 708, the inner spacers 319, and the unremoved portions of the gate dielectric layer 318 interposes the dielectric CPODE feature 790 and the source/drain features 321.

FIGS. 24A and 24B provide an alternative embodiment of the cross-sectional views of the device 300 along the third cutline (C-C) and the fourth cutline (D-D) of FIG. 1. One difference is that the dielectric CPODE feature 790 is formed after the CPODE trenches 704 are formed at block 214 but prior to the insulation layer is formed at block 216. Thus, the dielectric material of the dielectric CPODE feature 790 also fills the cavities 706. In other words, the dielectric CPODE feature 790 may interposes adjacent inner spacers 319 and be in direct contact with the source/drain features 321.

Generally, the device 300 may undergo further processing to form various features and regions. For example, subsequent processing may form multilayer interconnect features (e.g., metal layers and interlayer dielectrics) on the substrate 302, configured to connect the various features to form a functional circuit that may include one or more multi-gate devices. Further, while the method 200 has been shown and described as including the device 300 having a GAA device, it will be understood that other device configurations are possible. In some embodiments, the method 200 may be used to fabricate FinFET devices or other multi-gate devices.

With respect to the description provided herein, disclosed are structures and related methods for performing a CPODE process in converting some existing CPODE features in a circuit layout to power taps, providing electrical connectivity between frontside and backside power rails without a need to spare layout area to host extra power taps. The routing complexity is also reduced. Embodiments of the present disclosure can be readily integrated into existing semiconductor manufacturing processes.

In one exemplary aspect, the present disclosure is directed to a method of fabricating a semiconductor device. The method includes providing a dummy structure including a plurality of channel layers disposed over a frontside of a substrate, inner spacers disposed between adjacent channels of the plurality of channel layers and at lateral ends of the channel layers, and a gate structure interposing the plurality of channel layers, the dummy structure being disposed at an active edge adjacent to an active region; etching the gate structure and the plurality of channel layers to form a cut region along the active edge; depositing a conductive material in the cut region to form a conductive feature; thinning the substrate from a backside of the substrate to expose the conductive feature; and forming a backside metal wiring layer on the backside of the substrate, wherein the backside metal wiring layer is in electrical connection with the conductive feature. In some embodiments, the method further includes prior to the depositing of the conductive material, forming dielectric spacers interleaved with the inner spacers. A combination of the dielectric spacers and the inner spacers separates the conductive feature from contacting the active region. In some embodiments, the forming of the dielectric spacers includes depositing a dielectric liner along sidewalls of the cut region and filling space between the adjacent inner spacers; and performing an etch-back process to remove the dielectric liner from the sidewalls of the cut region, while a portion of the dielectric liner between the adjacent inner spacers remains as the dielectric spacers. In some embodiments, the forming of the dielectric spacers includes passivating the lateral ends of the channel layers to convert a semiconductor material in the lateral ends of the channel layers to a dielectric material. In some embodiments, the method further includes forming a frontside metal wiring layer over the frontside of the substrate, the frontside metal wiring layer being in electrical connection with the conductive feature. In some embodiments, the method further includes etching the gate structure to form a gate trench; and filling a dielectric material in the gate trench to form a cut metal gate (CMG) feature, the CMG feature being in contact with the conductive feature. In some embodiments, a bottom portion of the CMG feature is embedded in a dielectric isolation feature, and a portion of the conductive feature is directly under the dielectric isolation feature. In some embodiments, the dummy structure includes a gate spacer layer disposed on sidewalls of the gate structure, and a top portion of the conductive feature is directly above the gate spacer layer. In some embodiments, the conductive feature includes one of W, Ru, Mo, Co, or Cu. In some embodiments, the conductive feature includes a width along a lengthwise direction of the channel layers ranging from about 5 nm to about 20 nm, and the conductive feature includes a height ranging from about 100 nm to about 150 nm.

In another exemplary aspect, the present disclosure is directed to a method. The method includes forming a device over a substrate, the device including a first transistor in a first active region, a second transistor in a second active region, and a dummy transistor at a boundary between the first and second active regions, each of the first transistor, the second transistor, and the dummy transistor including a gate structure wrapping around a plurality of channel layers; forming a mask layer over the first transistor, the second transistor, and the dummy transistor; etching a portion of the mask layer to expose the dummy transistor; after exposing the dummy transistor, removing the gate structure and the channel layers from the dummy transistor; recessing a top portion of the substrate to form a trench through the dummy transistor at the boundary between the first and second active regions; and forming a conductive feature in the trench, the conductive feature extending through the substrate. In some embodiments, the method further includes forming a first metal line over the substrate; and forming a second metal line under the substrate, the first and second metal lines being in direct contact with the conductive feature. In some embodiments, the method further includes forming an isolation layer in the trench, the isolation layer separating the conductive feature from the first and second transistors. In some embodiments, the forming of the isolation layer includes depositing a dielectric liner on sidewalls and a bottom surface of the trench. In some embodiments, the isolation layer includes at least a first dielectric material and a second dielectric material interleaving each other. In some embodiments, the gate structure of the dummy transistor includes a gate dielectric layer and a metal layer, and after the removing of the gate structure from the dummy transistor, a portion of the gate dielectric layer remains in the trench. In some embodiments, the portion of the gate dielectric layer is in direct contact with the conductive feature.

In another exemplary aspect, the present disclosure is directed to a semiconductor device. The semiconductor device includes a transistor disposed in an active region, the transistor including a source/drain feature; conductive feature disposed at an active edge, the active edge defined at a boundary of the active region; a first metal line disposed above the source/drain feature; a second metal line disposed under the source/drain feature, the conductive feature extending continuously from the first metal line to the second metal line; and an isolation layer interposing the source/drain feature and the conductive feature. In some embodiments, the semiconductor device further includes a source/drain contact disposed on the source/drain feature, the source/drain contact being electrically coupled to the conductive feature through the first metal line. In some embodiments, the semiconductor device further includes a cut metal gate (CMG) feature dividing a gate structure of the transistor into segments, the conductive feature being in direct contact with the CMG feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   providing a dummy structure including a plurality of channel layers disposed over a frontside of a substrate, inner spacers disposed between adjacent channels of the plurality of channel layers and at lateral ends of the channel layers, and a gate structure interposing the plurality of channel layers, wherein the dummy structure is disposed at an active edge adjacent to an active region;
   etching the gate structure and the plurality of channel layers to form a cut region along the active edge;
   depositing a conductive material in the cut region to form a conductive feature;
   thinning the substrate from a backside of the substrate to expose the conductive feature; and
   forming a backside metal wiring layer on the backside of the substrate, wherein the backside metal wiring layer is in electrical connection with the conductive feature.

2. The method of claim 1, further comprising:
   prior to the depositing of the conductive material, forming dielectric spacers interleaved with the inner spacers, wherein a combination of the dielectric spacers and the inner spacers separates the conductive feature from contacting the active region.

3. The method of claim 2, wherein the forming of the dielectric spacers includes:
   depositing a dielectric liner along sidewalls of the cut region and filling space between the adjacent inner spacers; and
   performing an etch-back process to remove the dielectric liner from the sidewalls of the cut region, while a portion of the dielectric liner between the adjacent inner spacers remains as the dielectric spacers.

4. The method of claim 2, wherein the forming of the dielectric spacers includes:
   passivating the lateral ends of the channel layers to convert a semiconductor material in the lateral ends of the channel layers to a dielectric material.

5. The method of claim 1, further comprising:
   forming a frontside metal wiring layer over the frontside of the substrate, wherein the frontside metal wiring layer is in electrical connection with the conductive feature.

6. The method of claim 1, further comprising:
   etching the gate structure to form a gate trench; and
   filling a dielectric material in the gate trench to form a cut metal gate (CMG) feature, wherein the CMG feature is in contact with the conductive feature.

7. The method of claim 6, wherein a bottom portion of the CMG feature is embedded in a dielectric isolation feature, and wherein a portion of the conductive feature is directly under the dielectric isolation feature.

8. The method of claim 1, wherein the dummy structure includes a gate spacer layer disposed on sidewalls of the gate structure, and wherein a top portion of the conductive feature is directly above the gate spacer layer.

9. The method of claim 1, wherein the conductive feature includes one of W, Ru, Mo, Co, or Cu.

10. The method of claim 1, wherein the conductive feature includes a width along a lengthwise direction of the channel layers ranging from about 5 nm to about 20 nm, and wherein the conductive feature includes a height ranging from about 100 nm to about 150 nm.

11. A method, comprising:
    forming a device over a substrate, the device including a first transistor in a first active region, a second transistor in a second active region, and a dummy transistor at a boundary between the first and second active regions, wherein each of the first transistor, the second transistor, and the dummy transistor include a gate structure wrapping around a plurality of channel layers;
    forming a mask layer over the first transistor, the second transistor, and the dummy transistor;
    etching a portion of the mask layer to expose the dummy transistor;
    after exposing the dummy transistor, removing the gate structure and the channel layers from the dummy transistor;
    recessing a top portion of the substrate to form a trench through the dummy transistor at the boundary between the first and second active regions; and
    forming a conductive feature in the trench, the conductive feature extending through the substrate.

12. The method of claim 11, further comprising:
    forming a first metal line over the substrate; and
    forming a second metal line under the substrate, wherein the first and second metal lines are in direct contact with the conductive feature.

13. The method of claim 11, further comprising:
    forming an isolation layer in the trench, wherein the isolation layer separates the conductive feature from the first and second transistors.

14. The method of claim 13, wherein the forming of the isolation layer includes depositing a dielectric liner on sidewalls and a bottom surface of the trench.

15. The method of claim 13, wherein the isolation layer includes at least a first dielectric material and a second dielectric material interleaving each other.

16. The method of claim 11, wherein the gate structure of the dummy transistor includes a gate dielectric layer and a metal layer, and wherein after the removing of the gate structure from the dummy transistor, a portion of the gate dielectric layer remains in the trench.

17. The method of claim 16, wherein the portion of the gate dielectric layer is in direct contact with the conductive feature.

18. A semiconductor device, comprising:
    a transistor disposed in an active region, wherein the transistor includes a source/drain feature;
    a conductive feature disposed at an active edge, the active edge defined at a boundary of the active region;
    a first metal line disposed above the source/drain feature;

a second metal line disposed under the source/drain feature, wherein the conductive feature extends continuously from the first metal line to the second metal line; and an isolation layer interposing the source/drain feature and the conductive feature.

19. The semiconductor device of claim 18, further comprising:

a source/drain contact disposed on the source/drain feature, wherein the source/drain contact is electrically coupled to the conductive feature through the first metal line.

20. The semiconductor device of claim 18, further comprising:

a cut metal gate (CMG) feature dividing a gate structure of the transistor into segments, wherein the conductive feature is in direct contact with the CMG feature.

\* \* \* \* \*